United States Patent
Yamazaki

(10) Patent No.: US 7,977,206 B2
(45) Date of Patent: Jul. 12, 2011

(54) METHOD FOR MANUFACTURING SOI SUBSTRATE USING THE HEAT TREATMENT APPARATUS

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 151 days.

(21) Appl. No.: 12/350,265

(22) Filed: Jan. 8, 2009

(65) Prior Publication Data

US 2009/0181514 A1  Jul. 16, 2009

(30) Foreign Application Priority Data

Jan. 16, 2008 (JP) .................................. 2008-007062

(51) Int. Cl.
*H01L 21/30* (2006.01)
(52) U.S. Cl. ................ 438/455; 438/457; 257/E21.568; 257/E21.57
(58) Field of Classification Search .................. 438/406, 438/455, 457, 458; 257/E21.568, E21.57
See application file for complete search history.

(56) References Cited

U.S. PATENT DOCUMENTS

| | | | |
|---|---|---|---|
| 6,818,529 B2 | 11/2004 | Bachrach et al. | |
| 6,846,718 B1 | 1/2005 | Aga et al. | |
| 6,884,694 B2 * | 4/2005 | Park et al. | 438/455 |
| 7,176,102 B2 | 2/2007 | Aga et al. | |
| 2003/0207545 A1* | 11/2003 | Yasukawa | 438/459 |
| 2004/0266222 A1* | 12/2004 | Sata | 438/795 |
| 2007/0117354 A1* | 5/2007 | Gadkaree et al. | 438/478 |

FOREIGN PATENT DOCUMENTS

| | | |
|---|---|---|
| JP | 09-260618 | 10/1997 |
| JP | 11-163363 | 6/1999 |
| JP | 03-077831 | 3/2003 |
| JP | 2005-203714 | 7/2005 |
| JP | 2005-539259 | 12/2005 |
| JP | 2006-019625 | 1/2006 |
| WO | WO 01/28000 | 4/2001 |

* cited by examiner

*Primary Examiner* — Khiem D Nguyen
(74) *Attorney, Agent, or Firm* — Eric J. Robinson; Robinson Intellectual Property Law Office, P.C.

(57) ABSTRACT

A heat treatment apparatus is disclosed, which enables suppression of a warp of a base substrate to which a plurality of single crystal semiconductor substrates are bonded. An example of the apparatus comprises a treatment chamber, a supporting base provided in the treatment chamber, a plurality of supports which are provided over the supporting base and are arranged to support the base substrate, and a heating unit for heating the base substrate, where each position of the plurality of supports can be changed over the supporting base. The use of this apparatus contributes to the reduction in the region where the base substrate and the supports are in contact with each other, which allows uniform heating of the base substrate, leading to the formation of an SOI substrate with high quality.

19 Claims, 17 Drawing Sheets

(A-1)

(A-2)

METHOD FOR MANUFACTURING SOI SUBSTRATE USING THE HEAT TREATMENT APPARATUS

BACKGROUND OF THE INVENTION

1. Field of the Invention

The present invention relates to a heat treatment apparatus, a method for manufacturing an SOI (silicon on insulator) substrate using the heat treatment apparatus, and a method for manufacturing a semiconductor device using the SOI substrate.

2. Description of the Related Art

In recent years, integrated circuits using an SOI (silicon on insulator) substrate where a thin single crystal semiconductor film is formed on an insulating surface, instead of a bulk silicon wafer, have been developed. Since parasitic capacitance between a drain of a transistor and a substrate is reduced by using the SOI substrate, the SOI substrate has attracted attention due to the ability to improve performance of semiconductor integrated circuits.

As a method for manufacturing an SOI substrate, a hydrogen ion implantation separation method is known. An outline of a method for manufacturing an SOI substrate by using the hydrogen ion implantation separation method is described below. First, hydrogen ions are implanted into a silicon wafer by an ion implantation method to form an ion implantation layer at a predetermined depth from a surface. Next, the silicon wafer into which the hydrogen ions have been implanted is bonded to another silicon wafer with a silicon oxide film interposed therebetween. Then, in the following heat treatment, the ion implantation layer serves as a cleavage plane, and the silicon wafer in which the hydrogen ions have been implanted is separated. Accordingly, a single crystal silicon film can be formed over the silicon wafer which is to be a base substrate.

Further, a method has been proposed (for example, see Reference 1: Japanese Published Patent Application No. H11-163363), in which a single crystal silicon film is formed over a support substrate formed from glass by such a hydrogen ion implantation separation method. Further, recently, a technique has been disclosed, where small pieces of single crystal silicon are arranged into a tiled pattern over a glass substrate, as for a manufacturing method of an SOI substrate for an active matrix liquid crystal display (see Reference 2: Japanese Translation of PCT International Application No. 2005-539259).

Since a glass substrate can have a larger area and is less expensive than a silicon wafer, a glass substrate is used as a base substrate, whereby an inexpensive large-sized SOI substrate can be manufactured. A silicon ingot or a silicon wafer which is to be a base material for forming a single crystal silicon layer is generally small compared to a glass substrate. Accordingly, in the case of using a large-sized glass substrate as a base substrate, a plurality of silicon wafers are bonded to the large-sized glass substrate, which is effective in cost reduction.

Meanwhile, heat treatment of the substrate is required in a hydrogen ion implantation separation method. For example, in order to improve the bonding strength, heat treatment using an RTA (rapid thermal anneal) apparatus is proposed, in Reference 3: Japanese Published Patent Application No. H9-260618. In addition, heat treatment using an RTA apparatus is proposed to be performed after separation in Reference 4: PCT International Publication No. 01/28000.

In the case of heating a substrate using a heat treatment apparatus, in general, the substrate is placed on a support disposed in a treatment chamber, and then heat treatment is performed using a heating unit. For example, in the case of using an RTA apparatus, a plurality of lamps which are provided to face the substrate on the support are used as the heating unit.

SUMMARY OF THE INVENTION

It is preferable to perform such heating treatment on the substrate uniformly. However, in the case where heat capacity of a material of the support and that of the substrate are different, temperature of the substrate is easily changed locally at a portion which is in contact with the support. During heat treatment, if temperature of the substrate is locally changed, characteristics of a device which is manufactured using the substrate can be deteriorate. In order to solve such a problem, provision of a support unit at the periphery of a substrate is proposed in Reference 5: Japanese Published Patent Application No. 2006-19625, for the purpose of reducing influence of temperature change which is caused by contact between the support and the substrate.

In the case where heat treatment is performed providing a support unit only at the periphery of a substrate to be processed, the use of a large-sized substrate readily causes a warp of the substrate. In particular, the increase in size of the substrate that is subjected to heat treatment results in a remarkable warp of the substrate. For example, in the case of heat treatment performed on a base substrate provided with a semiconductor substrate on its surface, a warp of the base substrate causes problems such as defective bonding resulting from the separation of the semiconductor substrate, which is attached to the base substrate, from the base substrate, displacement of the semiconductor substrate, and the like. On the other hand, in the case where a plurality of supports are provided to allow contact with one surface of the base substrate as well as the periphery, quality of an obtained SOI substrate may be degraded due to local change of temperature generated in the base substrate.

In view of the above problems, it is an object to suppress a warp of a substrate in heat treatment and to suppress a quality defect caused by local change of temperature of the substrate.

An aspect of the invention to be disclosed is to control a position where a support is contacted with a substrate to be processed in heat treatment.

Specifics are described below.

An aspect of the invention to be disclosed includes a treatment chamber, a supporting base provided in the treatment chamber, a plurality of supports which are provided over the supporting base and support a substrate to be processed, and a heating unit for heating the substrate to be processed. Each position of the plurality of supports can be changed (variable) over the supporting base.

Another aspect of the invention to be disclosed includes a treatment chamber, a supporting base provided in the treatment chamber, a plurality of supports which are provided over the supporting base and support a substrate to be processed, and a heating unit for heating the substrate to be processed. The supporting base is provided with a plurality of fixing parts by which the supports can be attached to and detached from the supporting base. The plurality of supports are fixed over the supporting base selectively by the plurality of fixing parts, whereby each position of the plurality of the supports is variable.

Another aspect of the invention to be disclosed includes a treatment chamber, a plurality of supports for supporting a substrate to be processed in the treatment chamber, and a heating unit for heating the substrate to be processed, and the plurality of supports are arranged in a matrix form. Each of the plurality of supports is arranged to move up and down, whereby the number of supports which are contacted with the substrate to be processed and positions where the support is contacted with the substrate to be processed are variable.

Another aspect of the invention to be disclosed includes the following steps. A plurality of single crystal semiconductor substrates each of which is provided with an insulating film on a surface and has a separation layer formed at a predetermined depth from the surface and a base substrate which has a larger area than the single crystal semiconductor substrates are prepared. Each surface of the insulating films formed on the surfaces of the plurality of single crystal semiconductor substrates and a surface of the base substrate are bonded, whereby the plurality of single crystal semiconductor substrates are provided over the base substrate to form a gap between the plurality of single crystal semiconductor substrates. The base substrate provided with the plurality of single crystal semiconductor substrates is introduced into a treatment chamber of a heat treatment apparatus. A plurality of supports are arranged to be contacted with a rear surface of the base substrate to support the base substrate in the treatment chamber. Separation is performed along the separation layers by heat treatment, so that a plurality of single crystal semiconductor films are provided over the base substrate. In the heat treatment, the plurality of supports are contacted with the rear surface of the base substrate so as to be overlapped with the gap between the plurality of semiconductor substrates.

Another aspect of the invention to be disclosed includes the following steps. A plurality of single crystal semiconductor substrates each of which is provided with an insulating film on a surface and has a separation layer formed at a predetermined depth from the surface and a base substrate which has a larger area than the single crystal semiconductor substrates are prepared. Each surface of the insulating films formed on the surfaces of the plurality of single crystal semiconductor substrates and a surface of the base substrate are bonded, whereby the plurality of single crystal semiconductor substrates are arranged over the base substrate so as to have side surfaces which are contacted with each other. The base substrate provided with the plurality of single crystal semiconductor substrates is introduced into a treatment chamber of a heat treatment apparatus. A plurality of supports are contacted with a rear surface of the base substrate to support the base substrate in the treatment chamber. Separation is performed along the separation layers by heat treatment, so that a plurality of single crystal semiconductor films are provided over the base substrate. In the heat treatment, the plurality of supports are contacted with the rear surface of the base substrate so as to be overlapped with boundary portions of the plurality of single crystal semiconductor substrates which are adjacent to each other.

Note that the term "single crystal" in this specification refers to a crystal in which crystal faces and crystal axes do not vary in the entire of the crystal, and atoms or molecules which are included in the single crystal are arranged in a spatially ordered manner. However, although single crystals are structured by orderly aligned atoms, single crystals may include a lattice defect in which the alignment is disordered as a part or single crystals may include intended or unintended lattice strain.

Note that a semiconductor device in this specification generally indicates a device capable of functioning by utilizing semiconductor characteristics, and electro-optic devices, semiconductor circuits, and electronic appliances are all semiconductor devices.

In addition, in this specification, a display device includes a light-emitting device and a liquid crystal display device. The light-emitting device includes a light-emitting element, and the liquid crystal display device includes a liquid crystal element. The light-emitting element refers to an element, luminance of which is controlled by current or voltage, in its category. Specifically, the light-emitting element refers to an inorganic EL (electroluminescence) element, an organic EL element, and the like.

By a structure in which a position where a support is contacted with a substrate to be processed is controlled in heat treatment of the substrate, a warp of the substrate can be suppressed, and generation of quality defect in a device manufactured using the substrate, which is caused by local change of temperature of the substrate in the heat treatment, can be suppressed.

DETAILED DESCRIPTION OF THE INVENTION

Figure 1:
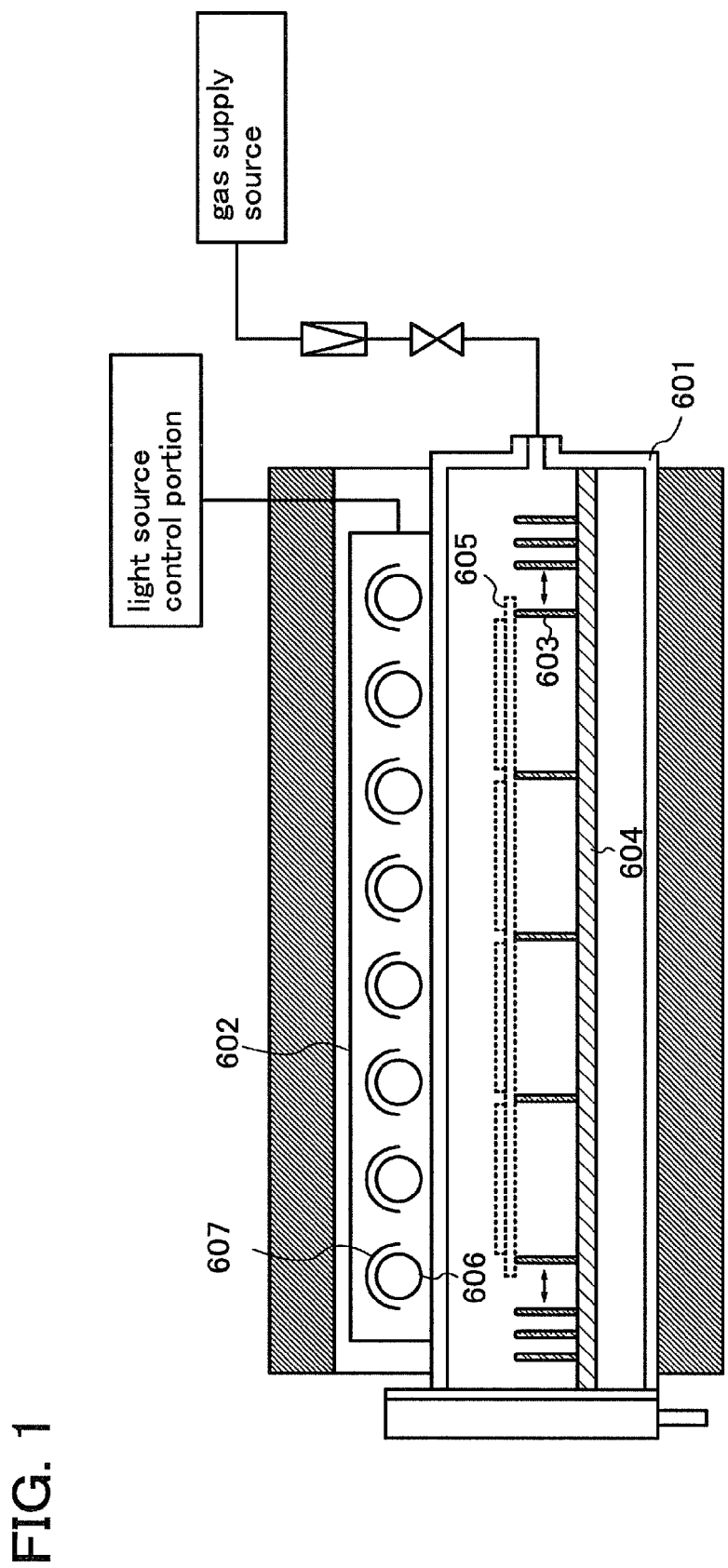
FIG. 1 illustrates an example of a heat treatment apparatus.

Embodiments will be described in detail with reference to the drawings. However, the present invention is not limited to the following description, and it is easily understood by those skilled in the art that modes and details of the present invention can be modified in various ways without departing from the purpose and the scope of the invention. Note that in a structure of the invention described below, like portions or portions having similar functions are denoted by the same reference numerals, and description thereof is not repeated.

Embodiment 1

In this embodiment, a structure of a heat treatment apparatus will be described with reference to drawings.

A heat treatment apparatus illustrated in FIG. 1 includes a treatment chamber 601, a heating unit 602 which heats a substrate 605 to be processed, and supports 603 which support the substrate 605 to be processed in the treatment chamber 601.

The treatment chamber 601 is a place where the substrate 605 to be processed is subjected to heat treatment and an inner wall of the treatment chamber 601 can be formed using quartz or the like. Further, a gas such as nitrogen, oxygen, or a rare gas is supplied from a gas supply source to the treatment chamber 601. By using such a gas, the substrate 605 to be processed can be cooled after heat treatment.

Any heating unit is acceptable as the heating unit 602 as long as it can heat the substrate 605 to be processed provided in the treatment chamber 601. For example, with a structure in which the heating unit 602 can rapidly heat the substrate 605 to be processed, heat treatment time can be shortened. Heating by the heating unit 602 may be performed by using a high temperature gas or lamp light. Note that, although the heating unit 602 illustrated in FIG. 1 is provided outside the treatment chamber 601, the heating unit 602 may be provided in the treatment chamber 601.

In FIG. 1, a structure of a lamp heat method is illustrated, in which the substrate 605 to be processed is subjected to heat treatment with use of a plurality of lamp light sources 606. Further, each of the lamp light sources 606 is provided with a reflective plate 607, so that the substrate 605 to be processed can be irradiated with light efficiently. As the lamp light source 606, for example, a rod-shaped halogen lamp can be used. The lamp light sources 606 are controlled by a light source control portion.

The plurality of supports 603 are provided over a supporting base 604 in the treatment chamber 601 and support the substrate 605 to be processed by being contacted therewith. The supports 603 can be formed using a material such as quartz. There is no particularly limitation on a cross-sectional shape (a shape of a surface which is brought to be in contact with the substrate 605 to be processed) of the supports 603, and a circular shape, an ellipsoidal shape, a rectangular shape, or the like is possible.

Further, each position of the plurality of supports 603 over the supporting base 604 can be changed (variable). Specifically, the plurality of supports 603 are arranged to move in a plane which is parallel to a surface of the substrate 605 to be processed. Thus, by control of positions of the supports 603 over the supporting base 604, positions where the supports 603 are contacted with the substrate 605 to be processed can be controlled.

The heat treatment apparatus described in this embodiment has a structure in which, even when temperature is locally changed due to contact between the substrate 605 to be processed and the supports 603, the portions where temperature is changed can be controlled by control of positions where the supports 603 are contacted with the substrate 605 to be processed. Therefore, positions where the supports 603 are contacted with the substrate 605 to be processed are optionally determined depending on the size or application of the substrate 605 subjected to heat treatment, whereby a warp of the substrate 605 can be suppressed, and generation of quality defects in a device manufactured using the substrate 605 can be suppressed, which are caused by local change of temperature of the substrate 605.

Further, the heat treatment apparatus described in this embodiment may have a structure in which the number of the supports 603 which are contacted with the substrate 605 to be processed can also be controlled in addition to the positions where the supports 603 are contacted with the substrate 605 to be processed.

Figure 2:
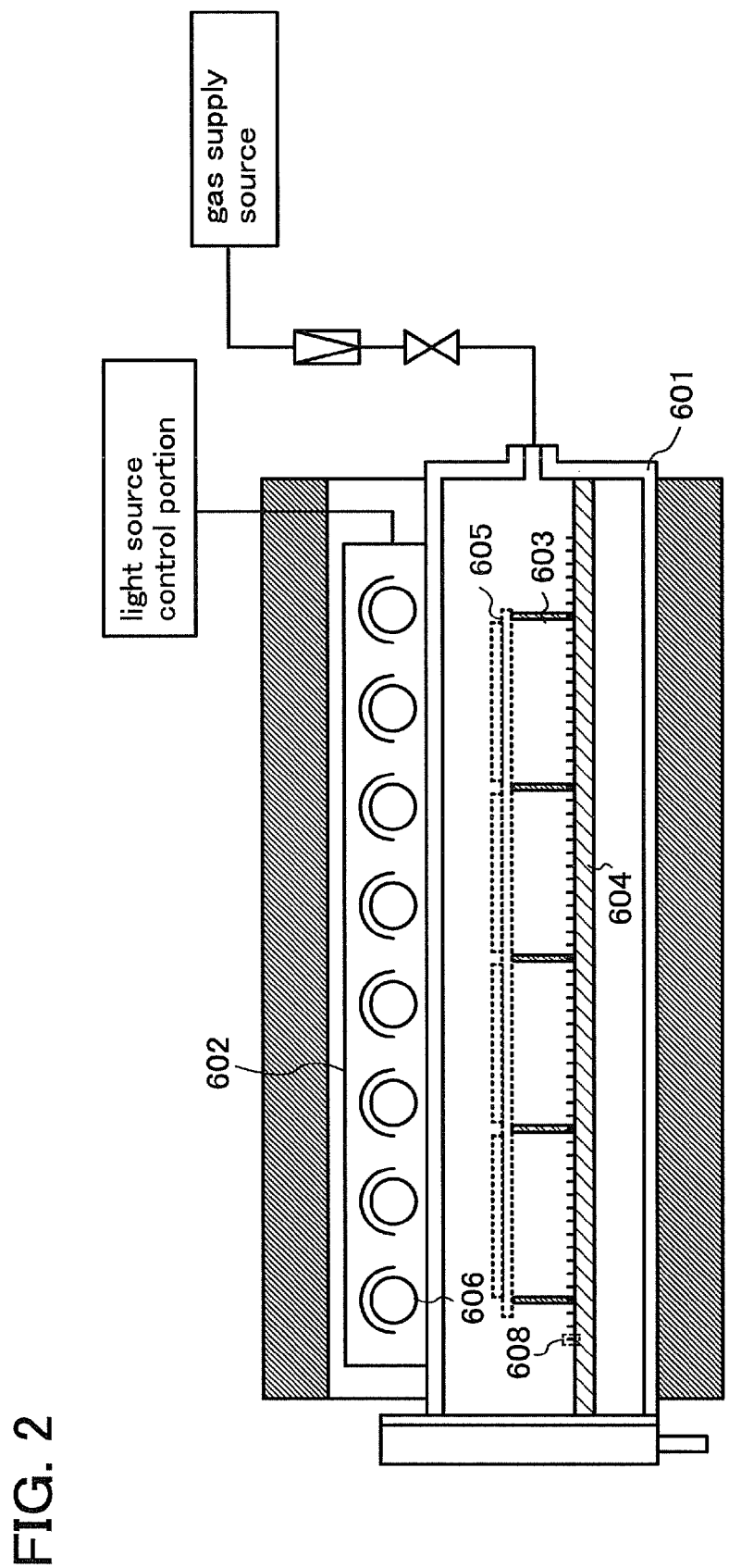
FIG. 2 illustrates an example of a heat treatment apparatus.

Alternatively, a structure may be employed, in which a plurality of fixing parts 608 by which the supports 603 can be attached to and detached from the supporting base 604 are provided over the supporting base 604 and the plurality of supports 603 are fixed over the supporting base 604 by the plurality of fixing parts 608 selectively, whereby positions of the plurality of supports 603 over the supporting base 604 can be changed (variable) (see FIG. 2). Namely, the plurality of supports 603 are arranged to move in a plane which is parallel to a surface of the substrate 605 to be processed. The plurality of fixing parts 608 may be arranged in a matrix form. Additionally, the number of the plurality of supports 603 may be smaller than that of the plurality of fixing parts 608. Note that the fixing parts 608 may have any structure as long as the supports 603 can be fixed over the supporting base 604. In FIG. 2, components to which the supports 603 can be inserted are provided as the fixing parts 608 over the supporting base 604; however, the structure of the fixing parts 608 is not limited thereto. Openings or depressed portions, for example, may be provided for the supporting base 604 and the supports 603 may be inserted to the openings or the depressed portions.

When the fixing parts 608 are arranged in matrix, positions and the number of the supports 603 can be minutely adjusted. In the case where patterns of the positions where the supports 603 are provided are roughly determined in advance, the fixing parts 608 may be provided in accordance with the plurality of patterns.

Figure 3:
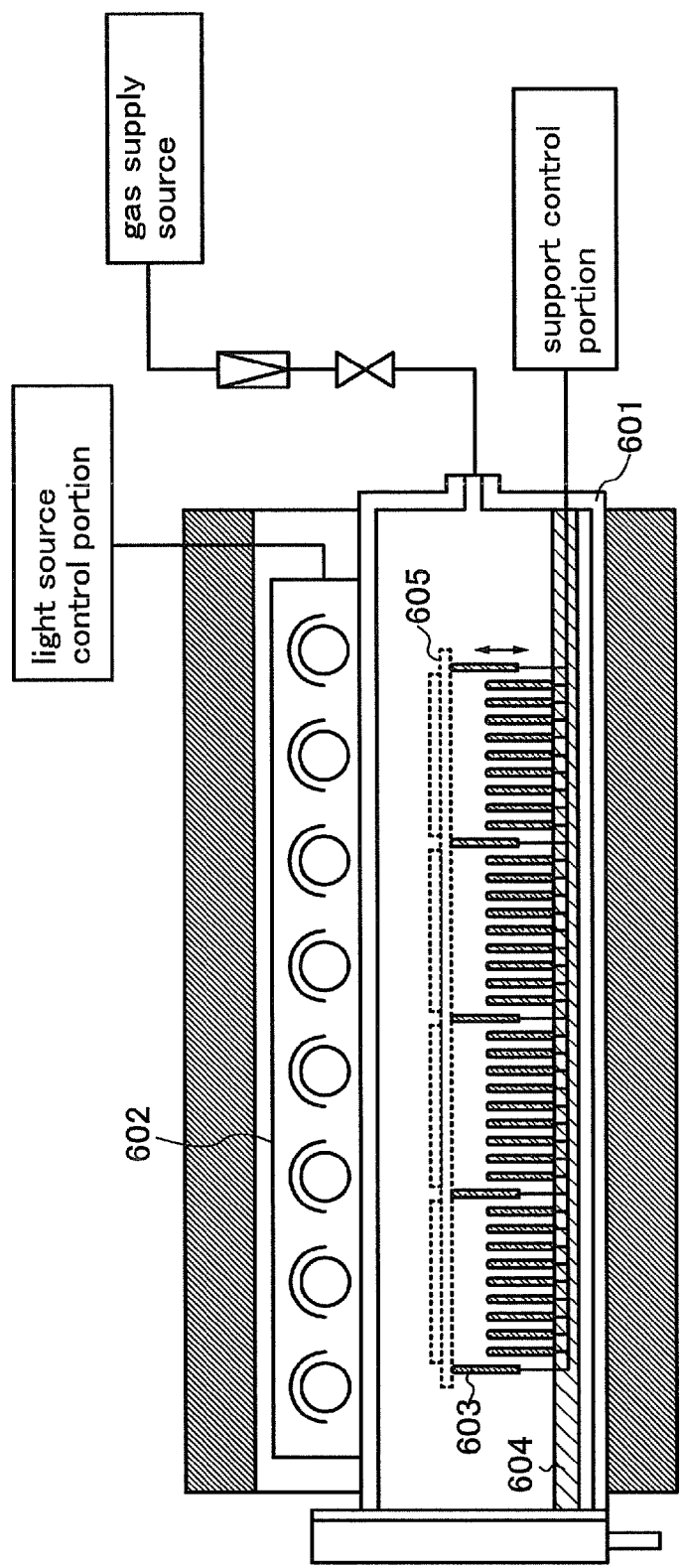
FIG. 3 illustrates an example of a heat treatment apparatus.

In addition, the heat treatment apparatus can have a structure as illustrated in FIG. 3, in which a plurality of supports 603 are arranged in a matrix form over the supporting base 604, and each of the plurality of supports 603 is configured to move up and down to control the height thereof, whereby the number of supports 603 which are contacted with the substrate 605 to be processed and positions where the supports 603 are contacted with the substrate 605 to be processed can be controlled. Namely, the plurality of supports 603 are arranged not only to move in a plane which is parallel to a surface of the substrate 605 to be processed but to move in a direction of a normal line with respect to the surface of the substrate 605. Up and down of the supports 603 is controlled by a support control portion, and for example, more than one support 603 can be moved up and down separately. Therefore, as to the heat treatment apparatus demonstrated in FIG. 1 and FIG. 3, the plurality of supports 603 can be moved during the heating of the substrate 605.

In such a manner, the number of the supports 603 which are contacted with the substrate 605 to be processed and positions where the supports 603 are contacted with the substrate 605 to be processed are controlled depending on the size and application of the substrate 605 which is subjected to heat treatment, whereby a warp of the substrate 605 can be suppressed, and quality defects caused by local change of temperature of the substrate 605 can be suppressed.

Note that heat treatment with the heat treatment apparatus described in this embodiment can be performed in combination with any of a method for manufacturing an SOI substrate or a method for manufacturing a semiconductor device described in another embodiment of this specification as appropriate.

Embodiment 2

In this embodiment, an example of a method for manufacturing an SOI substrate with use of the heat treatment apparatus described in Embodiment 1 will be described with reference to drawings.

First, a plurality of semiconductor substrates are prepared. Here, the case of using a semiconductor substrate 100a, a semiconductor substrate 100b, and a semiconductor substrate 100c is described (see FIG. 4A (A-1)).

As each of the semiconductor substrates 100a to 100c, a commercial single crystal semiconductor substrate can be used. For example, a single crystal silicon substrate, a single crystal germanium substrate, and a compound semiconductor substrate of gallium arsenide, indium phosphide, or the like can be used. A size of a commercial silicon substrate is typically five inches (125 mm) in diameter, six inches (150 mm) in diameter, eight inches (200 mm) in diameter, or 12 inches (300 mm) in diameter, and a typical shape thereof is a circular shape. Note that the silicon substrate is not limited to have a circular shape, and a silicon substrate processed to have a rectangular shape or the like can be used. In the following description, the case of using single crystal silicon substrates as the semiconductor substrates 100a to 100c is described.

Figure 4A:
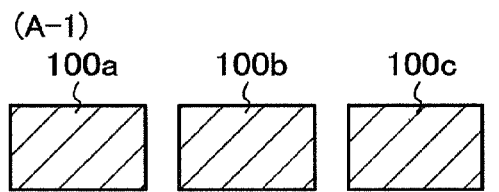
FIGS. 4A to 4D illustrate an example of a manufacturing method of an SOI substrate.
Figure 4A:
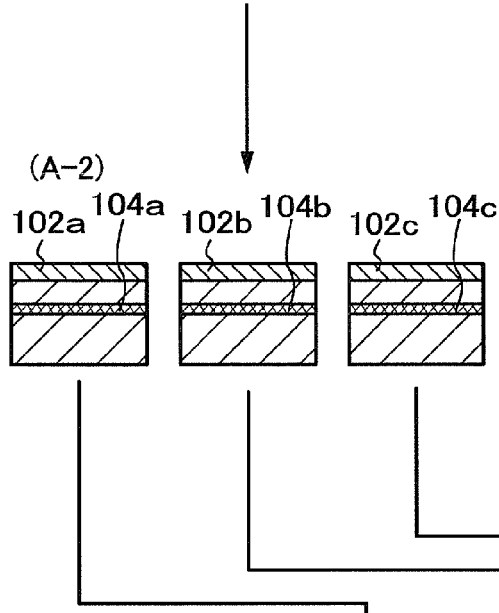

Next, an insulating film 102a is provided on a surface of the semiconductor substrate 100a, and a separation layer 104a is provided at a predetermined depth from the surface of the semiconductor substrate 100a (see FIG. 4A (A-2)). In a manner similar to formation of the insulating film 102a and the separation layer 104a, an insulating film 102b and an insulating film 102c are provided on a surface of the semiconductor substrate 100b and a surface of the semiconductor substrate 100c, respectively, and a separation layer 104b and a separation layer 104c are provided at a predetermined depth from the surface of the semiconductor substrate 100b and the surface of the semiconductor substrate 100c, respectively.

As the insulating films 102a to 102c, for example, a single layer of a silicon oxide film, a silicon oxynitride film, a silicon nitride film, a silicon nitride oxide film, or the like, or a stacked layer thereof can be used. Such films can be formed by a thermal oxidation method, a CVD method, a sputtering method, or the like. In the case of forming the insulating films 102a to 102c by a CVD method, a silicon oxide film formed using organosilane such as tetraethoxysilane (abbreviation: TEOS, chemical formula: $Si(OC_2H_5)_4$) can be used.

For example, after a silicon oxynitride film and a silicon nitride oxide film are sequentially stacked over the semiconductor substrates 100a to 100c, ions are added into a predetermined depth from the surfaces of the semiconductor substrates 100a to 100c. Then, a silicon oxide film may be formed over the silicon nitride oxide film using tetraethoxysilane by a CVD method.

Note that the silicon oxynitride film means a film that has higher composition of oxygen than that of nitrogen and, in the case where measurements are performed using Rutherford backscattering spectrometry (RBS) and hydrogen forward scattering (HFS), concentrations of oxygen, nitrogen, silicon, and hydrogen range from 50 at. % to 70 at. %, 0.5 at. % to 15 at. %, 25 at. % to 35 at. %, and 0.1 at. % to 10 at. %, respectively. Further, a silicon nitride oxide film means a film that has higher composition of nitrogen than that of oxygen and shows concentrations of oxygen, nitrogen, silicon, and hydrogen at concentrations ranging from 5 at. % to 30 at. %, 20 at. % to 55 at. %, 25 at. % to 35 at. %, and 15 at. % to 25 at. %, respectively, in the case where measurement is performed using RBS and HFS. Note that percentages of nitrogen, oxygen, silicon, and hydrogen fall within the ranges given above, where the total number of atoms contained in the silicon oxynitride film or the silicon nitride oxide film is defined as 100 atomic %.

The separation layers 104a to 104c can be formed by addition of ions into a predetermined depth from the surfaces of the semiconductor substrates 100a to 100c, respectively.

Each depth at which the separation layers 104a to 104c are formed can be adjusted by the acceleration energy of the added ions and the incidence angle thereof. The acceleration energy can be adjusted by an acceleration voltage, dosage, or the like. The separation layers 104a to 104c are formed in a region at a depth the same or substantially the same as the average penetration depth of the ions. The thickness of semiconductor films which are separated from the semiconductor substrates 100a to 100c in a later step is determined depending on the depth at which the ions are added. The depth where the separation layers 104a to 104c are formed is 10 nm to 500 nm, inclusive, preferably, 50 nm to 200 nm, inclusive.

As a gas which is used for adding ions, a hydrogen gas, a rare gas, and the like are given. In this embodiment, it is preferable to use a hydrogen gas. When a hydrogen gas is used in an ion doping method, ion species which are generated are $H^+$, $H_2^+$, and $H_3^+$, and it is preferable that the proportion of $H_3^+$ be the largest. The addition efficiency of $H_3^+$ is higher than those of $H^+$ and $H_2^+$, and thus, addition time can be shortened.

Figure 4B:
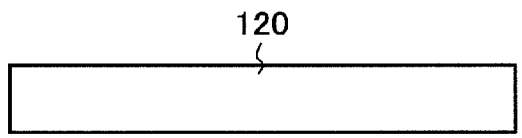

Next, a base substrate 120 is prepared (see FIG. 4B).

As the base substrate 120, a substrate formed of an insulator is used. Specifically, a glass substrate used in the electronics industry, such as an aluminosilicate glass substrate, an aluminoborosilicate glass substrate, or a barium borosilicate glass substrate can be used as the base substrate 120. With use of a glass substrate which can have a large area and is inexpensive as the base substrate 120, the cost can be more reduced than the case of using a silicon wafer.

Figure 4C:
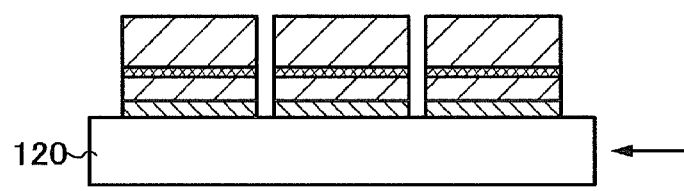

Next, the plurality of semiconductor substrates 100a to 100c are faced to the base substrate 120 so as to bond surfaces of the insulating films 102a to 102c to a surface of the base substrate 120 (see FIG. 4C). The surfaces of the insulating films 102a to 102c which is formed over the semiconductor substrates 100a to 100c, respectively, are attached to the surface of the base substrate 120 to form a bonding. This bond is formed under the action of a van der Waals force, and by attaching the base substrate 120 and the semiconductor substrates 100a to 100c to each other, a bond contributed by hydrogen bonding can be formed. The case where the plurality of semiconductor substrates 100a to 100c are provided to form a gap therebetween over the base substrate 120 is illustrated in FIG. 4C; however, it is not limited thereto. The plurality of semiconductor substrates 100a to 100c may be arranged so as to have side surfaces which are contacted with each other.

Note that it is preferable that the base substrate 120 and the insulating films 102a to 102c formed over the semiconductor substrates 100a to 100c be subjected to surface treatment before the semiconductor substrates 100a to 100c and the base substrate 120 are bonded. As the surface treatment, ozone treatment (e.g., cleaning with ozone-containing water) can be performed. Megasonic cleaning may be performed before cleaning with ozone-containing water. Cleaning with ozone-containing water and cleaning by hydrofluoric acid may be performed plural times. By such surface treatment, dust such as an organic substance attached to the surfaces of the insulating films 102a to 102c and the surface of the base substrate 120 are removed, so that the surfaces can be made hydropbilic.

Alternatively, plasma treatment may be performed as the surface treatment. For example, an inert gas (e.g., an Ar gas) and/or a reactive gas (e.g., an $O_2$ gas or an $N_2$ gas) is introduced into a chamber which is in a vacuum state, and bias voltage is applied to the surface to be processed (here, the base substrate 120 side) to produce plasma. In this case, electrons and cations of Ar are present in plasma, and the cations of Ar are accelerated in a direction toward a cathode (the surface to be processed side). By collision of the accelerated cations of Ar with the surface to be processed, the surface to be processed can be subjected to sputter etching. At this time, the sputter etching is conducted preferentially on projected portions of the surface, which can improve planarity of the surface.

Figure 4D:
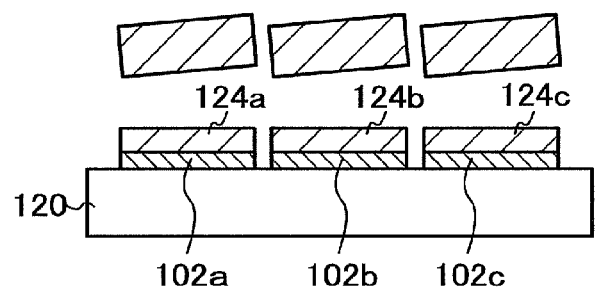

Next, heat treatment is performed to separate the semiconductor substrates along the separation layers 104a to 104c, so that single crystal semiconductor films 124 to 124c are provided over the base substrate 120 with the insulating films 102a to 102c interposed therebetween (see FIG. 4D). Here, by heat treatment at 400° C. to 750° C., separation of the semiconductor substrates along the separation layers becomes possible. When the heat treatment apparatus has a structure in which the base substrate 120 that is a substrate to be processed and the semiconductor substrates can be heated rapidly, heat treatment time can be shortened. In this case, a temperature higher than a strain point of the base substrate 120 can be employed. As heat treatment, a gas rapid thermal anneal method in which heating is performed using a high temperature gas or a lamp rapid thermal anneal method in which heating is performed using lamp light can be applied.

Figure 9A:
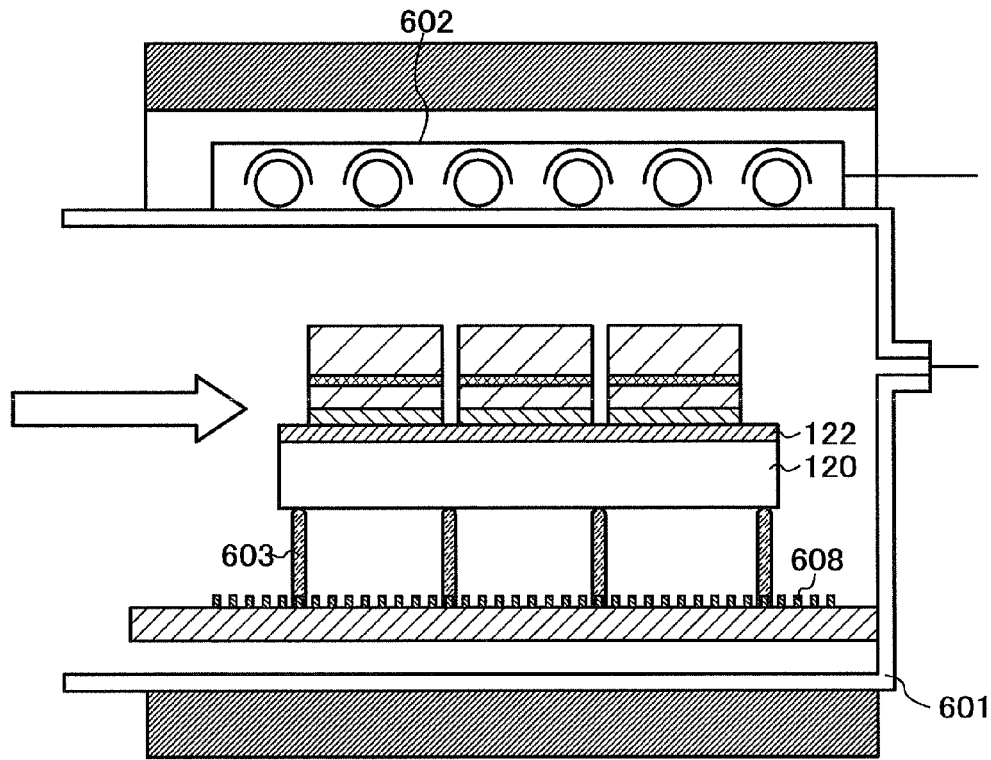
FIGS. 9A and 9B illustrate an example of a manufacturing method of an SOI substrate.
Figure 9B:
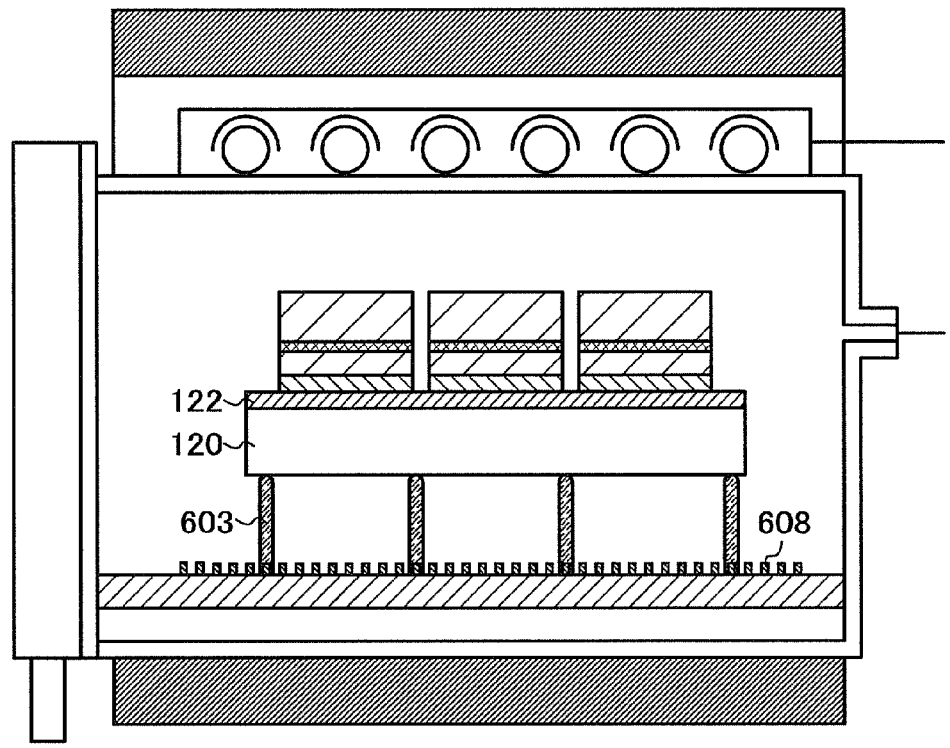

Note that the heat treatment illustrated in FIG. 4D is performed with use of the heat treatment apparatus described in Embodiment 1. A specific method of heat treatment is described below with reference to FIGS. 9A and 9B. FIGS. 9A and 9B illustrate the case where the heat treatment apparatus of FIG. 2 is applied.

First, the base substrate 120 provided with the plurality of semiconductor substrates is carried into the treatment chamber 601 of the heat treatment apparatus (see FIG. 9A). The base substrate 120 carried into the treatment chamber 601 is disposed in the treatment chamber 601 with use of the plurality of supports 603. In the treatment chamber 601, the plurality of supports 603 are contacted with a rear surface of the base substrate 120, whereby the base substrate 120 is supported.

Here, the plurality of supports 603 are contacted with the rear surface of the base substrate 120 so as to be overlapped with gap portions between the plurality of semiconductor substrates. That is, by control of positions of the supports 603, positions where the supports 603 are contacted with the base substrate 120 are set so as not to be overlapped with the semiconductor substrates provided over the base substrate 120.

After the positions where the plurality of supports 603 are contacted with the base substrate 120 are set optionally in such a manner, heat treatment is performed (see FIG. 9B), so that regions where temperature is changed in the base substrate 120 due to contact with the supports 603 can be limited to regions where the semiconductor substrates are not provided (the gap portions between neighboring semiconductor substrates among the plurality of semiconductor substrates).

Figure 5A:
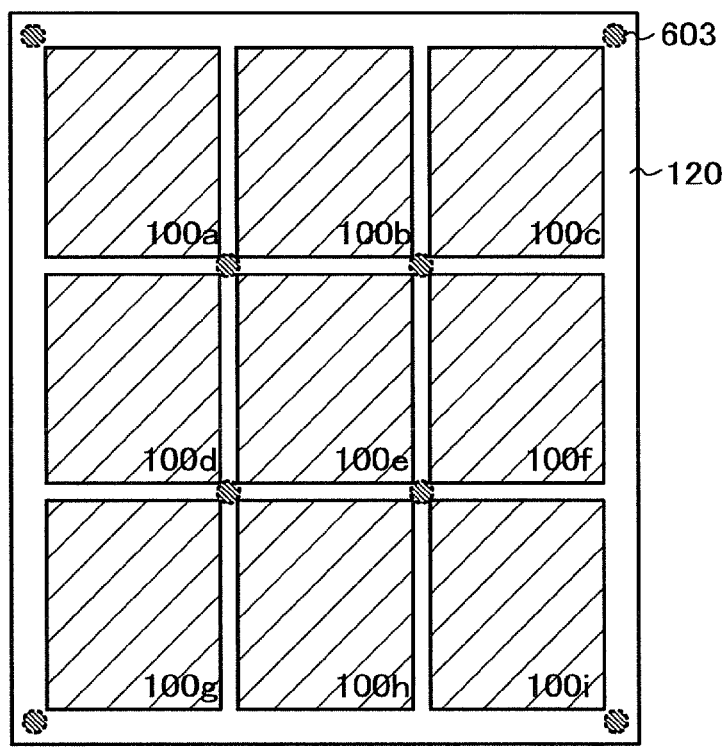
FIGS. 5A and 5B each illustrate an example of a manufacturing method of an SOI substrate.

For example, in the case where nine (3×3) semiconductor substrates 100a to 100i are bonded and provided over the base substrate 120, the supports 603 can be contacted with the rear surface of the base substrate 120 at portions where corners of each of four semiconductor substrates among the semiconductor substrates 100a to 100i are close to each other and at four corner portions of the base substrate 120 (see FIG. 5A). In this case, change in temperature of regions where the base substrate 120 is overlapped with the semiconductor substrates 100a to 100i is reduced and a warp of the base substrate 120 is suppressed, so that bonding defects between the base substrate 120 and the semiconductor substrates 100a to 100i can be reduced.

Figure 5B:
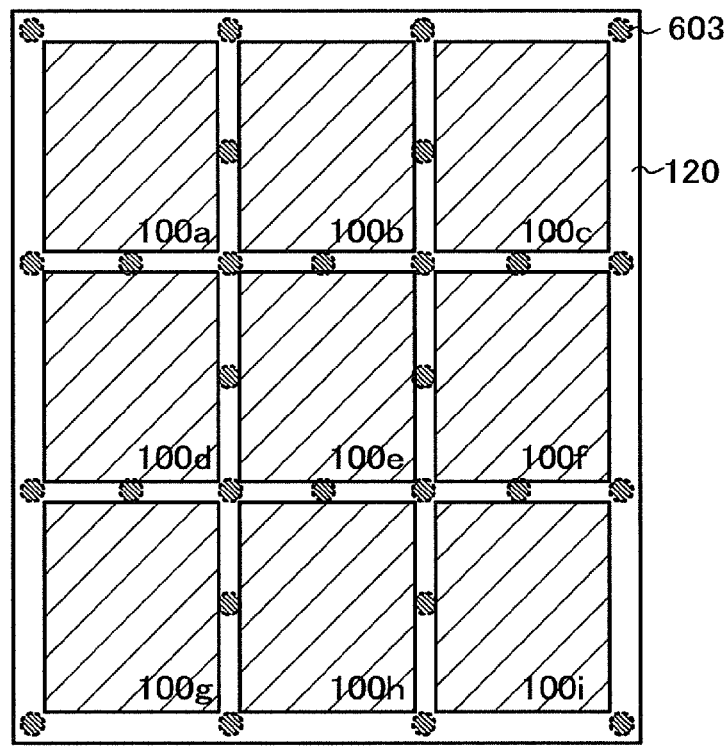

The positions where the supports 603 are contacted with the base substrate 120 are not limited to those of FIG. 5A. The supports 603 may be provided to be contacted with the base substrate 120 at gap portions between the semiconductor substrates, in addition to the portions where the corners of the plurality of semiconductor substrates are close to each other (see FIG. 5B). In this case, even when the base substrate 120 has a large area, a warp of the base substrate 120 can be suppressed efficiently.

In such a manner, heat treatment is performed by control of the number of the supports 603 which are contacted with the base substrate 120 and the positions where the supports 603 are contacted with the base substrate 120, whereby a warp of the base substrate 120 and quality defects of the SOI substrate which is caused by local change of temperature in the base substrate 120, can be suppressed.

Although the supports 603 are contacted with the rear surface of the base substrate 120 to support the base substrate 120 in the above description, the support 603 may be contacted with a top surface of the base substrate 120 to support the base substrate 120 in the case where a gap between a plurality of semiconductor substrates provided over the base substrate 120 is completely wider than width of the support 603. In this case, a plurality of supports 603 may be contacted with regions where the semiconductor substrates are not provided on the surface of the base substrate 120.

Figure 6A:
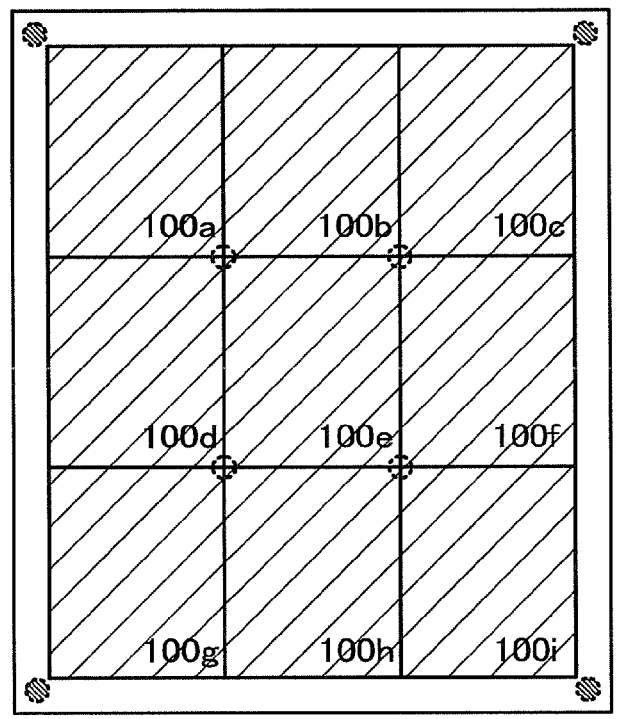
FIGS. 6A and 6B each illustrate an example of a manufacturing method of an SOI substrate.
Figure 6B:
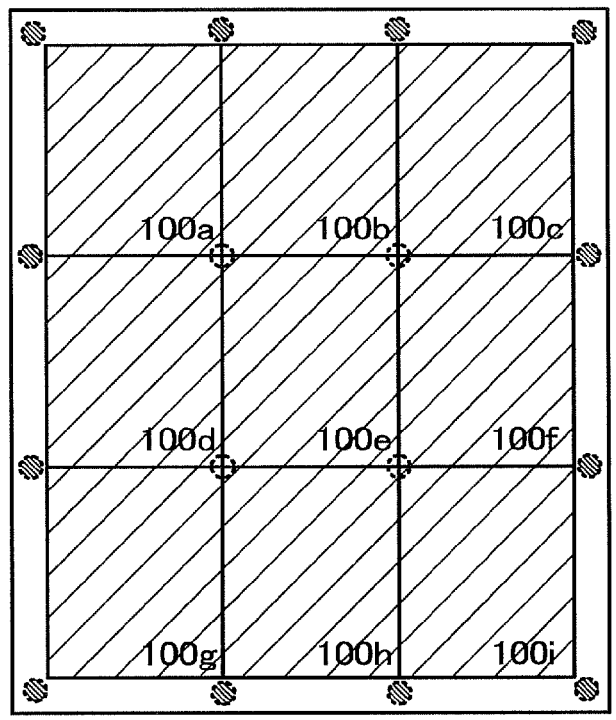

In the case where a gap between a plurality of semiconductor substrates provided over the base substrate is narrower than width of the support 603 (e.g., the case where the plurality of semiconductor substrates are arranged so that side surfaces thereof can be in contact with each other), positions where the supports 603 are contacted with the base substrate 120 are controlled so as to be overlapped with boundary portions between the plurality of semiconductor substrates (see FIGS. 6A and 6B). The positions where the base substrate 120 and the supports 603 are contacted are controlled in such a manner, whereby portions of the base substrate 120, where temperature is changed due to contact with the supports 603, can be limited to the regions where the supports 603 are overlapped with edge portions of the semiconductor substrates. In this case, single crystal semiconductor films corresponding to the edge portions of the semiconductor substrates can be removed from the obtained SOI substrate, and the other parts of single crystal semiconductor films are utilized to form an element, whereby quality defects of a device formed using the SOI substrate can be suppressed.

In accordance with the above steps, the SOI substrate can be manufactured, where the single crystal semiconductor films 124a to 124c are provided over the base substrate 120 with the insulating films 102a to 102c interposed therebetween, respectively.

Note that in addition to the above steps, planarization treatment may be performed on a surface of the obtained SOI substrate. By planarization treatment, the surface of the SOI substrate can be planarized even in the case where projections and depressions are produced, after separation, on surfaces of the single crystal semiconductor films 124a to 124c provided over the base substrate 120.

For planarization treatment, CMP (chemical mechanical polishing), etching treatment, laser light irradiation, or the like can be performed. For example, etching treatment (etchback treatment) of either dry etching or wet etching, or a combination thereof is performed, which is followed by the laser light irradiation to recrystallize the single crystal semiconductor films 124a to 124c and planalize the surfaces thereof.

By irradiation with laser light from above the top surfaces of the single crystal semiconductor films, the top surfaces of the single crystal semiconductor films can be melted. After being melted, the single crystal semiconductor films are cooled and solidified to obtain single crystal semiconductor films each having the top surface whose planarity is improved. With use of laser light, the base substrate 120 is not heated directly; thus, rise in temperature of the base substrate 120 can be suppressed. Therefore, a low-heat-resistant substrate such as a glass substrate can be used as the base substrate 120.

Note that it is preferable that the single crystal semiconductor films be partially melted by the laser light irradiation. This is because, if the single crystal semiconductor films are completely melted, they are microcrystallized from a liquid phase due to disordered nucleation, so that crystallinity of the single crystal semiconductor films is highly likely to decrease. On the contrary, by partial melting, crystal growth proceeds from a solid phase part which is not melted. Accordingly, defects in the single crystal semiconductor films can be reduced. Note that "complete melting" here refers to that the single crystal semiconductor films are transformed to a liquid state by melting up to the vicinity of the lower interface of the single crystal semiconductor films. On the other hand, "partial melting" in this case refers to that the upper parts of the single crystal semiconductor films are melted to be made in a liquid phase whereas the lower parts thereof are kept in a solid phase without being melted.

A pulsed laser is preferably used for the laser irradiation. This is because a pulsed laser beam having high energy can be emitted instantaneously and a melting state can be formed easily. The repetition rate is preferably about 1 Hz to 10 MHz, inclusive.

After the above-described laser light irradiation, a step of reducing the thickness of the single crystal semiconductor films may be performed. For the reduction of the thickness of the single crystal semiconductor films, etching treatment (etch-back treatment) of either dry etching or wet etching, or a combination thereof may be employed. For example, when the single crystal semiconductor films are each formed of a silicon material, the thickness thereof can be reduced by dry etching using $SF_6$ and $O_2$ as a process gas.

Note that planarization treatment may be performed on the semiconductor substrates 100a to 100c which have been separated from the base substrate 120, in addition to the SOI substrate. When surfaces of the semiconductor substrates 100a to 100c which have been separated from the base substrate 120 are planarized, the semiconductor substrates 100a to 100c can be reused for manufacture of another SOI substrate.

Note that in this embodiment, the heat treatment apparatus described in Embodiment 1 is used for heat treatment which is performed after bonding the semiconductor substrates to the base substrate. In addition to the case of this embodiment, the beat treatment apparatus described in Embodiment 1 may also be used for heat treatment in another process. Further, the method for manufacturing an SOI substrate described in this embodiment can be performed in combination with a manufacturing method described in another embodiment in this specification, as appropriate.

Embodiment 3

In this embodiment, a method for manufacturing a thin film transistor (TFT) with use of the SOI substrate manufactured in Embodiment 2 will be described.

First, a method for manufacturing an n-channel thin film transistor and a p-channel thin film transistor is described with reference to FIGS. 12A to 12D and FIGS. 13A to 13C. Various kinds of semiconductor devices can be formed by combining a plurality of thin film transistors (TFTs).

Figure 12A:
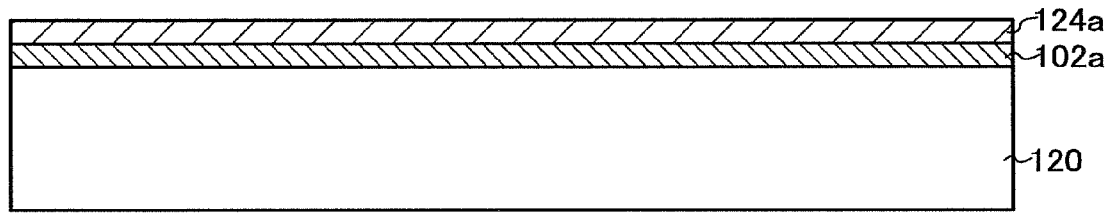
FIGS. 12A to 12D illustrates an example of a manufacturing method of a semiconductor device using an SO substrate.

FIG. 12A is a cross-sectional view of the SOI substrate formed by the method described in Embodiment 2.

Figure 12B:
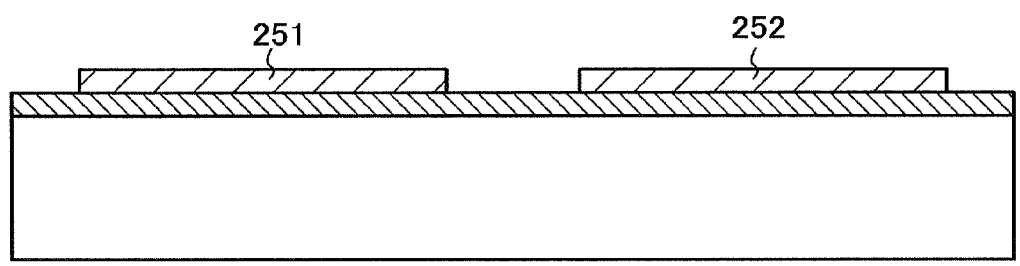

First, the single crystal semiconductor film 124a is subjected to patterning by etching, so that semiconductor films 251 and 252 are formed (see FIG. 12B). The semiconductor film 251 is included in an n-channel TFT, and the semiconductor film 252 is included in a p-channel TFT.

Figure 12C:
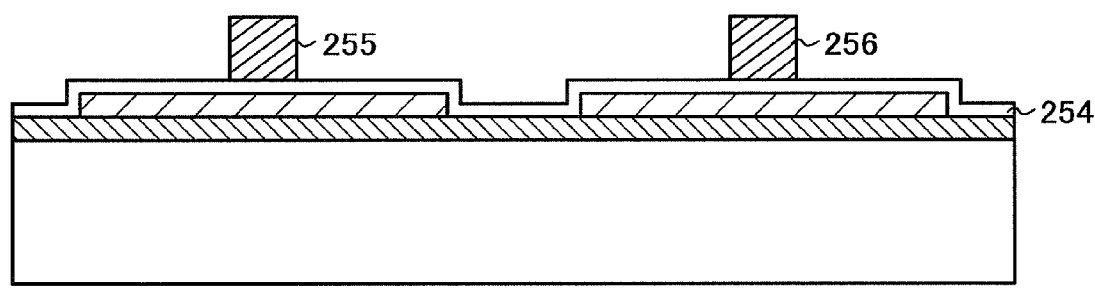

Next, an insulating film 254 is formed over the semiconductor films 251 and 252, and then a gate electrode 255 and a gate electrode 256 are formed over the semiconductor film 251 and the semiconductor film 252, respectively, with the insulating film 254 interposed therebetween (see FIG. 12C).

Note that before the single crystal semiconductor film 124a is etched, it is preferable to add an impurity element such as boron, aluminum, or gallium or an impurity element such as phosphorus or arsenic into the single crystal semiconductor film 124a in order to control the threshold voltage of the TFTs.

Figure 12D:
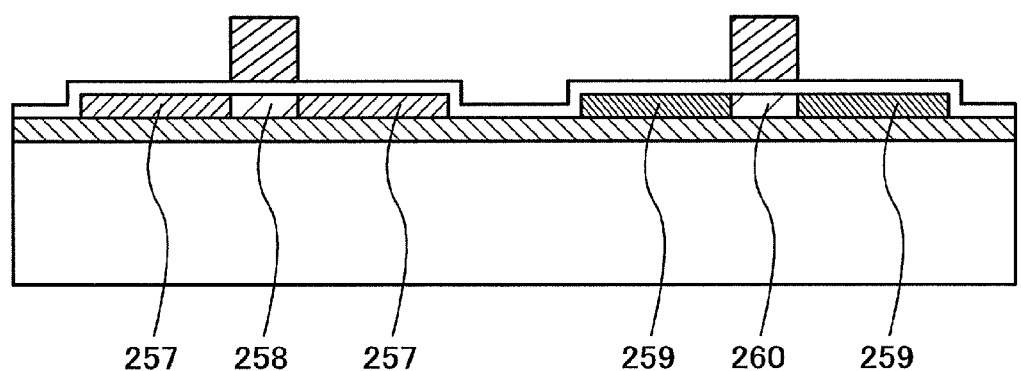

Next, n-type low-concentration impurity regions 257 are formed in the semiconductor film 251, and p-type high-concentration impurity regions 259 are formed in the semiconductor film 252 (see FIG. 12D). Specifically, first, the n-type low-concentration impurity regions 257 are formed in the semiconductor film 251. In order to form the n-type low-concentration impurity regions 257, the semiconductor film 252 included in the p-channel TFT is covered with a resist mask, and an impurity element is added into the semiconductor film 251. As the impurity element, phosphorus or arsenic may be added. In adding the impurity element by an ion doping method or an ion implantation method, the gate electrode 255 serves as a mask, and the n-type low-concentration impurity regions 257 are formed in the semiconductor film 251 in a self-aligned manner A region of the semiconductor film 251, which is overlapped with the gate electrode 255, serves as a channel formation region 258.

Next, after the mask which covers the semiconductor film 252 is removed, the semiconductor film 251 included in the n-channel TFT is covered with a resist mask. Then, an impurity element is added into the semiconductor film 252 by an ion doping method or an ion implantation method. As the impurity element, boron can be added. In the step of adding the impurity element, the gate electrode 256 serves as a mask and the p-type high-concentration impurity regions 259 are formed in the semiconductor film 252 in a self-aligned manner. The p-type high-concentration impurity regions 259 serve as a source region and a drain region. A region of the semiconductor film 252, which is overlapped with the gate electrode 256, serves as a channel formation region 260. Here, the method in which the p-type high-concentration impurity regions 259 are formed after the n-type low-concentration impurity regions 257 are formed is described; however, the p-type high-concentration impurity regions 259 can be formed first.

Next, after the resist which covers the semiconductor film 251 is removed, an insulating film having a single-layer structure of a nitrogen-containing compound such as silicon nitride or an oxide such as silicon oxide or a stacked structure thereof is formed by a plasma CVD method or the like. This insulating film is anisotropically etched in a perpendicular direction to form sidewalls of insulating films 261 and 262 which are in contact with side surfaces of the gate electrodes 255 and 256, respectively (see FIG. 13A). By this anisotropic etching, the insulating film 254 is also etched.

Figure 13A:
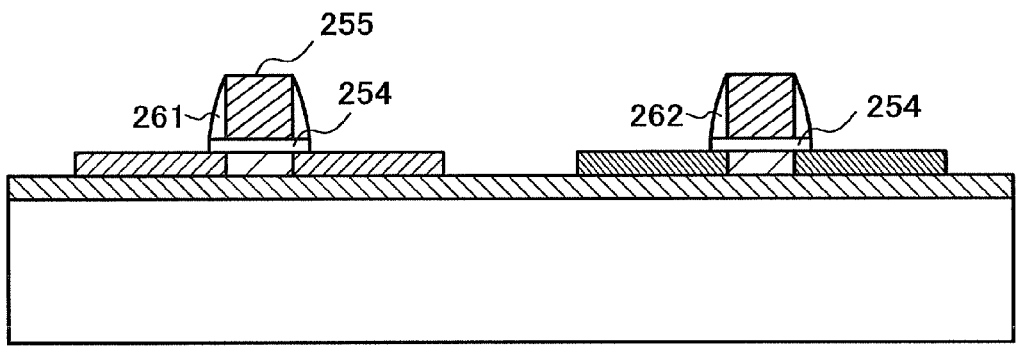
FIGS. 13A to 13C illustrate an example of a manufacturing method of a semiconductor device using an SOI substrate.
Figure 13B:
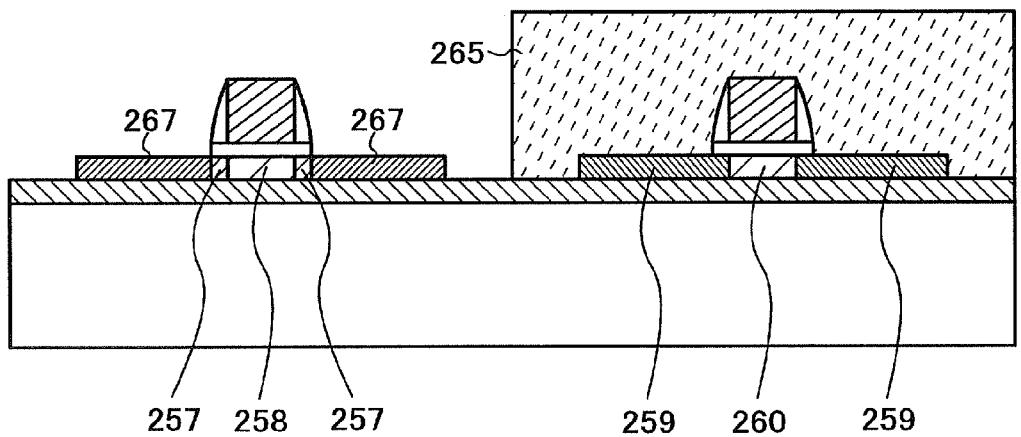

Next, as illustrated in FIG. 13B, the semiconductor film 252 is covered with a resist 265. In order to form high-concentration impurity regions serving as a source region and a drain region in the semiconductor film 251, an impurity element is added into the semiconductor film 251 at high dose by an ion implantation method or an ion doping method. The gate electrode 255 and the sidewall of the insulating film 261 serve as a mask, and n-type high-concentration impurity regions 267 are formed. Then, heat treatment for activation of the impurity element is performed. Note that the heat treatment apparatus described in Embodiment 1 can be used for heat treatment.

Figure 13C:
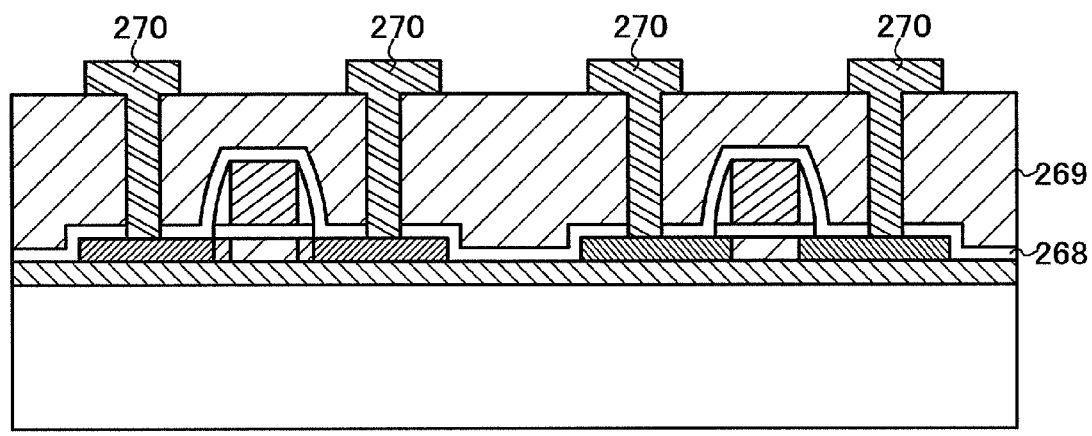

After the heat treatment for activation, an insulating film 268 containing hydrogen is formed as illustrated in FIG. 13C. After the insulating film 268 is formed, heat treatment is performed at a temperature of 350° C, to 450° C. inclusive, so that hydrogen contained in the insulating film 268 is diffused into the semiconductor films 251 and 252. The insulating film 268 can be formed by deposition of silicon nitride or silicon nitride oxide by a plasma CVD method at a process temperature equal to or lower than 350° C. The supply of hydrogen to the semiconductor films 251 and 252 makes it possible to compensate defects in the semiconductor films 251 and 252 efficiently.

After that, an interlayer insulating film 269 is formed. The interlayer insulating film 269 can have a single-layer structure or a stacked structure of any one or more of films selected from an insulating film containing an inorganic material, such as a silicon oxide film or a BPSG (borophosphosilicate glass) film, and an organic resin film containing polyimide, acrylic, or the like. After contact holes are formed in the interlayer insulating film 269, wirings 270 are formed as illustrated in FIG. 13C. The wirings 270 can be formed using a conductive film having a three-layer structure in which a low-resistance metal film such as an aluminum film or an aluminum-alloy film is sandwiched between barrier metal films. The barrier metal films can be formed using metal films which include molybdenum, chromium, titanium, and/or the like.

Through the above steps, a semiconductor device having the n-channel TFT and the p-channel TFT can be manufactured.

Embodiment 4

In this embodiment, a method for manufacturing a thin film transistor, which is different from that in Embodiment 3, will be described with reference to drawings. The method for manufacturing a thin film transistor described in this embodiment has a feature that openings for connecting a semiconductor film and a wiring is formed in a self-aligned manner.

First, an SOI substrate formed by the method described in Embodiment 2 is prepared. A semiconductor film of the SOI substrate is patterned to form an island-shaped semiconductor film 906, and then an insulating film 908 serving as a gate insulating film and a conductive film serving as a gate electrode (or a wiring) are sequentially formed. In this embodiment, the conductive film serving as the gate electrode is formed to have a two-layer structure; however, the structure of the gate electrode is not limited thereto. Here, the insulating film 908 can be formed using a material such as silicon oxide, silicon oxynitride, silicon nitride oxide, or silicon nitride by a CVD method, a sputtering method, or the like. The thickness of the insulating film 908 may be about 5 nm to 100 nm inclusive. The conductive film can be formed using a material such as tantalum (Ta), tungsten (W), titanium (Ti), molybdenum (Mo), aluminum (Al), copper (Cu), chromium (Cr), or niobium (Nb) by a CVD method, a sputtering method, or the like. The thickness of the conductive film may be set to about 100 nm to 500 nm inclusive in total of the two layers. In this embodiment, the insulating film 908 is formed using silicon oxide (with a thickness of 20 nm), the conductive film (lower layer) is formed using tantalum nitride (with a thickness of 50 nm), and the conductive film (upper layer) is formed using tungsten (with a thickness of 200 nm).

Next, the conductive film serving as the gate electrode is patterned. Note that in the method for manufacturing a thin film transistor in this embodiment, patterning is performed at least twice with respect to the above conductive film. Here, first patterning is performed. By the first patterning, a conductive film 910 and a conductive film 912, each of which is larger than the gate electrode in final form, are formed. Here, the size which is "larger" means the size with which a resist mask used in a second patterning for formation of the gate electrode can be formed in accordance with positions of the conductive film 910 and the conductive films 912. Note that the both first patterning and second patterning may be performed on a region which is overlapped with the island-shaped semiconductor film 906; that is, it is not necessary that an entire surface of the conductive film be subjected to patterning twice.

Figure 15A:
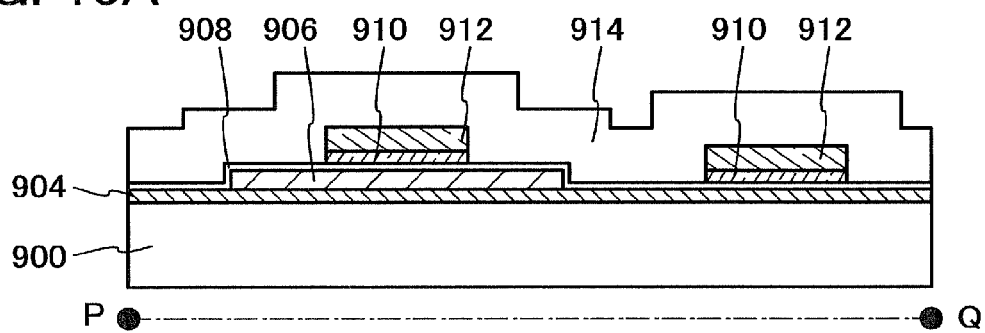
FIGS. 15A to 15D illustrates an example of a manufacturing method of an SOI substrate.
Figure 17A:
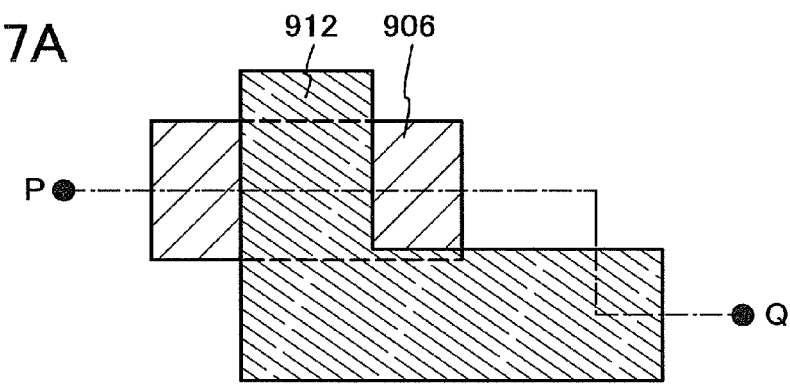
FIGS. 17A to 17D illustrate an example of a manufacturing method of an SOI substrate.

After that, an insulating film 914 is formed to cover the insulating film 908, the conductive film 910, and the conductive film 912 (see FIG. 15A and FIG. 17A). Here, the insulating film 914 can be formed using a material such as silicon oxide, silicon oxynitride, silicon nitride oxide, silicon nitride, hafnium oxide, or aluminum oxide by a CVD method, a sputtering method, or the like. It is preferable that the thickness of the insulating film 914 be about 0.5 μm to 2 μm, inclusive. In this embodiment, the insulating film 914 is formed using silicon oxide (with a thickness of 1 μm) as an example. Note that this embodiment is described using an SOI substrate having a structure in which an insulating film 904 and the semiconductor film 906 are sequentially formed over a base substrate 900; however, this embodiment is not construed as being limited thereto.

Figure 15B:
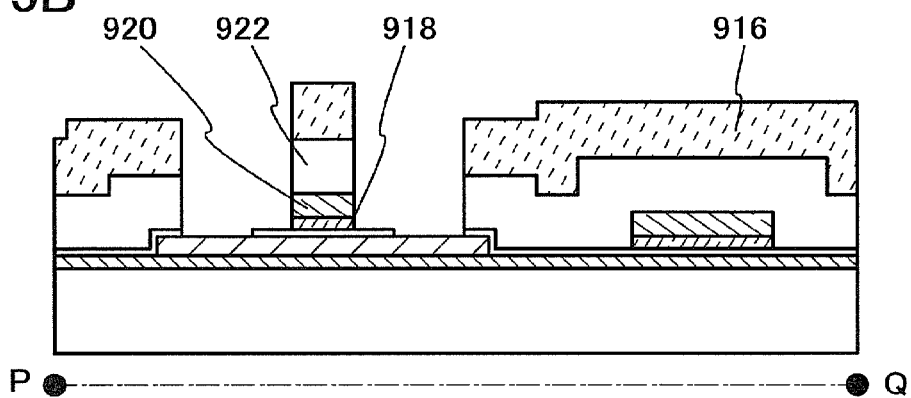

Note that FIG. 15A is a cross-sectional view taken along a line P-Q of FIG. 17A that is a plan view. Similarly, FIG. 15B corresponds to FIG. 17B, FIG. 15D corresponds to FIG. 17C, and FIG. 16C corresponds to FIG. 17D. In the plan views of FIGS. 17A to 17D, components which are illustrated in the cross-sectional views are partly omitted for simplicity.

Next, a resist mask 916 for formation of the gate electrode, which is used in patterning, is formed over the insulating film 914. This patterning corresponds to the second patterning of the patterning steps performed twice with respect to the conductive films. The resist mask 916 can be formed in such a manner that a resist material that is a photosensitive material is applied and exposed to light to form a pattern. After the resist mask 916 is formed, the conductive film 910, the conductive film 912, and the insulating film 914 are patterned with use of the resist mask 916. Specifically, after the insulating film 914 is selectively etched to form an insulating film 922, the conductive film 910 and the conductive film 912 are selectively etched, so that a conductive film 918 and a conductive film 920 serving as a gate electrode are formed (see FIG. 15B and FIG. 17B). Here, when the insulating film 914 is selectively etched, the insulating film 908 serving as the gate insulating film is partly etched at the same time.

Then, the resist mask 916 is removed. After that, an insulating film 924 is formed to cover the island-shaped semiconductor film 906, the insulating film 908, the conductive film 918, the conductive film 920, the insulating film 922, and the like. The insulating film 924 serves as a barrier layer in formation of sidewalls in a later step. The insulating film 924 can be formed using a material such as silicon oxide, silicon oxynitride, silicon nitride oxide, silicon nitride, hafnium oxide, aluminum oxide, or tantalum oxide. However, in order to allow the insulating film 924 to serve as a barrier layer, it is preferable that the selection ratio of the etching rate of a material used for the sidewalls in a later step to that of a material used for the insulating film 924 be high. The insulating film 924 may have a thickness of 10 nm to 200 nm inclusive. In this embodiment, the insulating film 924 is formed using silicon nitride (with a thickness of 50 nm).

Figure 15C:
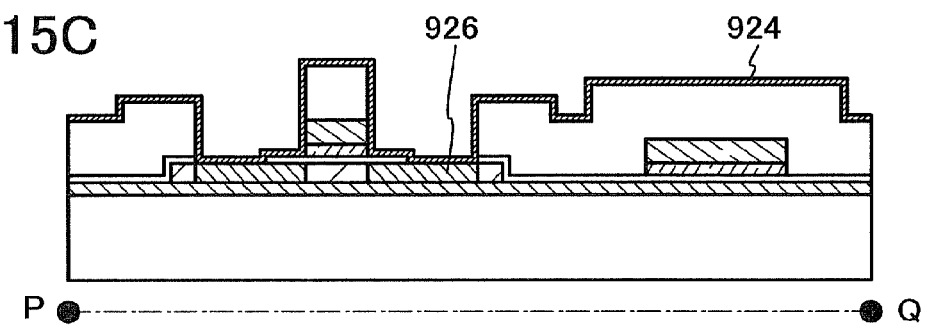

After the insulating film 924 is formed, an impurity element imparting one conductivity type is added to the island-shaped semiconductor film 906 with use of the conductive film 918, the conductive film 920, the insulating film 922, and the like as masks. In this embodiment, an n-type impurity element (e.g., phosphorus or arsenic) is added to the island-shaped semiconductor film 906. By addition of the impurity element, impurity regions 926 are formed in the island-shaped semiconductor film 906 (see FIG. 15C). Note that the n-type impurity element is added after formation of the insulating film 924, here; however, this embodiment is not limited to the above. For example, the impurity element may be added after or before the resist mask is removed, and then the insulating film 924 may be formed. Alternatively, an impurity element to be added can be a p-type impurity element.

Figure 15D:
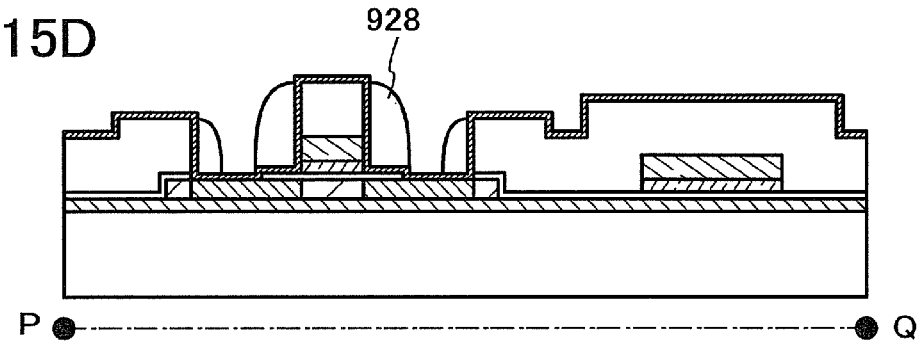
Figure 17B:
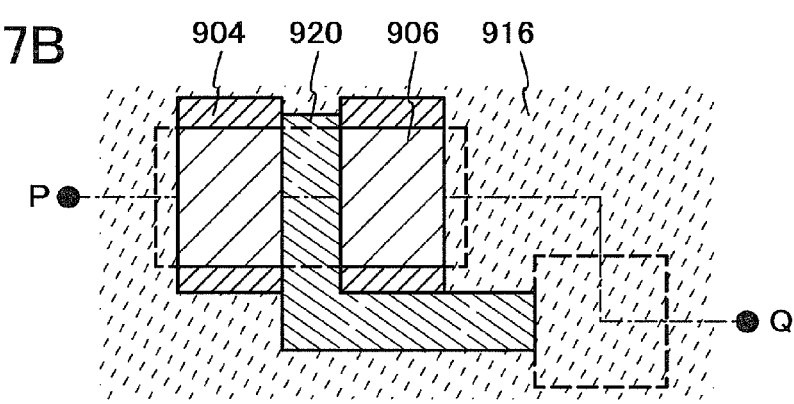
Figure 17C:
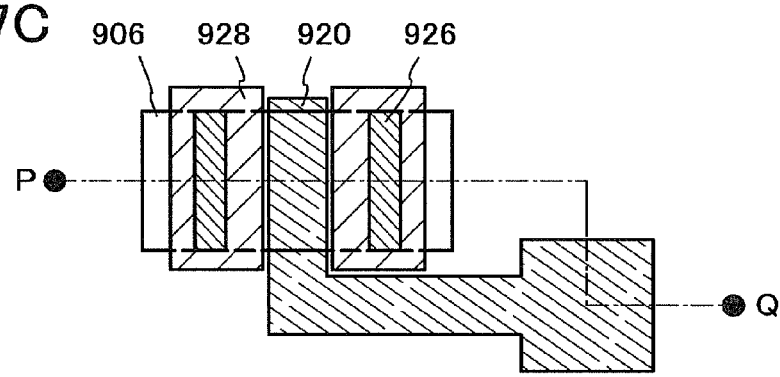

Next, sidewalls 928 are formed (see FIG. 15D and FIG. 17C). For formation of the sidewalls 928, an insulating film is formed to cover the insulating film 924, and then anisotropic etching mainly in a perpendicular direction is performed on the insulating film. This is because the insulating film is selectively etched due to the anisotropic etching. The insulating film can be formed using a material such as silicon oxide, silicon oxynitride, silicon nitride oxide, silicon nitride, hafnium oxide, aluminum oxide, or tantalum oxide by a CVD method, a sputtering method, or the like. Further, a film including an organic material may be formed by a spin coating method or the like. In this embodiment, silicon oxide is used as a material of the insulating material. In other words, the sidewalls 928 are formed using silicon oxide. In addition, as an etching gas, a mixed gas of $CHF_3$ and helium can be used. Note that the step of forming the sidewalls 928 is not limited to the above.

Next, an impurity element imparting one conductivity type is added to the island-shaped semiconductor film 906 with use of the insulating film 922, the sidewalls 928, and the like as masks. Note that the impurity element added to the island-shaped semiconductor film 906 at this time has the same conductivity type as the impurity element which has been added in the previous step and is added at higher concentration than that of the impurity element in the previous step. In other words, an n-type impurity element is added in this embodiment.

Figure 16A:
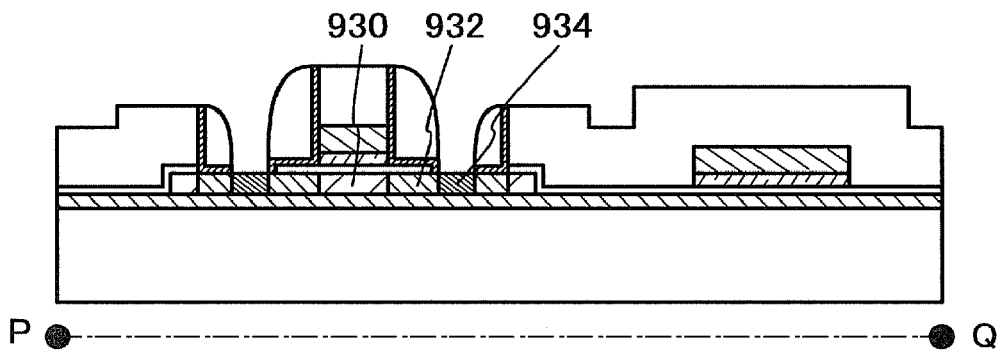
FIGS. 16A to 16C illustrate an example of a manufacturing method of an SOI substrate.

A channel formation region 930, low-concentration impurity regions 932, and high-concentration impurity regions 934 are formed in the island-shaped semiconductor film 906 by addition of the impurity element (FIG. 16A). The low-concentration impurity regions 932 each serve as an LDD (Lightly Doped Drain) region and the high-concentration impurity regions 934 each serve as a source or a drain.

Next, the insulating film 924 is etched to form openings (contact holes) reaching the high-concentration impurity regions. In this embodiment, since the insulating film 922 and the sidewalls 928 are formed using silicon oxide and the insulating film 924 is formed using silicon nitride, the insulating film 924 can be etched selectively to form the openings.

Figure 16B:
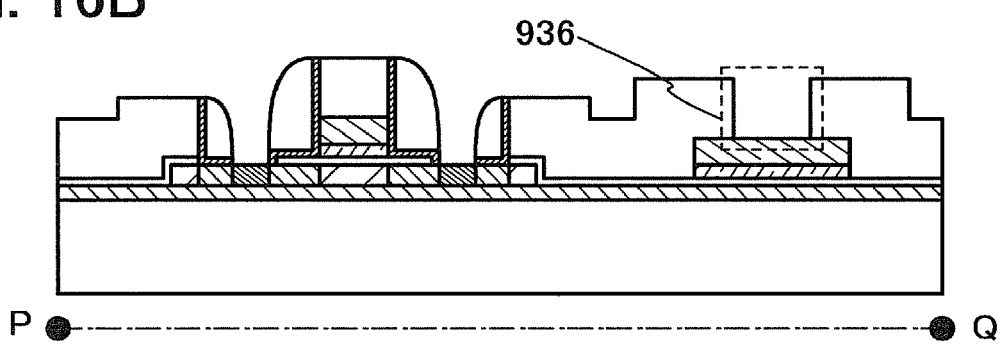

After the openings reaching the high-concentration impurity regions are formed, the insulating film 914 is selectively etched, whereby an opening 936 is formed (see FIG. 16B). The opening 936 is formed larger than each of the openings reaching the high-concentration impurity regions. This is because the minimum line width of the opening 936 is determined in accordance with the process rule or the design rule, whereas the openings reaching the high-concentration impurity regions are formed in a self-aligned manner, thereby being miniaturized.

After that, a conductive film is formed, which is in contact with the high-concentration impurity regions 934 of the island-shaped semiconductor film 906 and the conductive film 920 through the openings reaching the high-concentration impurity regions and the opening 936. The conductive film can be formed by a CVD method, a sputtering method, or the like. A material such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si) can be used. Moreover, an alloy containing the aforementioned metal as the main component or a compound containing the aforementioned metal may be used. The conductive film may have a single-layer structure or a stacked structure. In this embodiment, the conductive film has a three-layer structure of titanium, aluminum, and titanium.

Figure 16C:
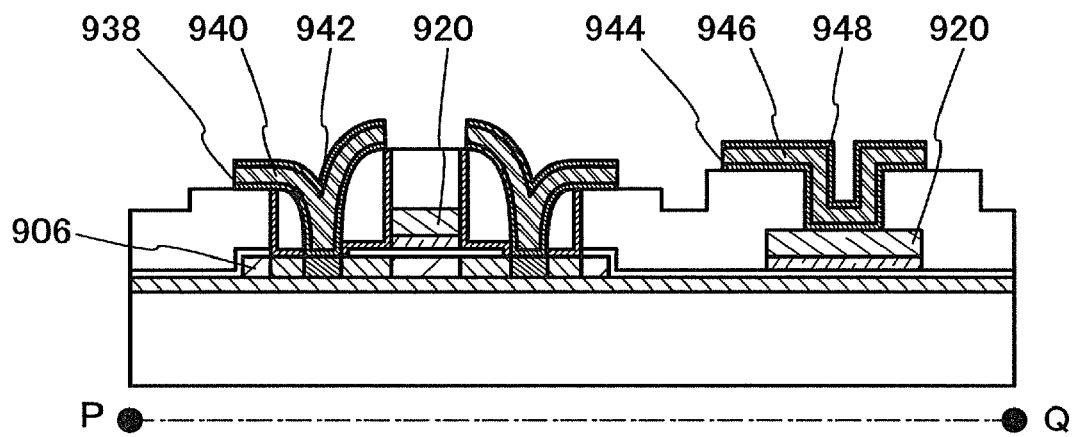
Figure 17D:
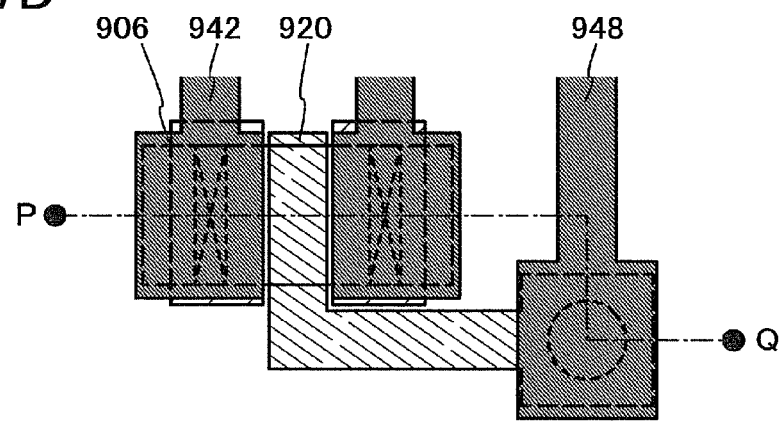

The conductive film is etched selectively to form a stacked layer of a conductive film 938, a conductive film 940, and a conductive film 942, which serves as a source or drain electrode (a source or drain wiring) and a stacked layer of a conductive film 944, a conductive film 946, and a conductive film 948, which is connected to the conductive film 920 and serves as a wiring (see FIG. 16C and FIG. 17D). Through the process, a thin film transistor is completed, in which the island-shaped semiconductor film 906 and the conductive film serving as the source or drain electrode are connected in a self-aligned manner.

In accordance with the method described in this embodiment, connection of the source or drain electrode can be formed in a self-aligned manner; therefore, a structure of the transistor can be miniaturized. That is, the degree of integration of semiconductor elements can be improved. Since the lengths of channel and low-concentration impurity region can be determined in a self-aligned manner, variation in channel resistance that is to be a problem in miniaturization can be suppressed. In other words, the transistor with excellent characteristics can be provided.

Embodiment 5

In this embodiment, specific modes of a semiconductor device to which the thin film transistor described in the above embodiment is applied will be described with reference to drawings.

Figure 7:
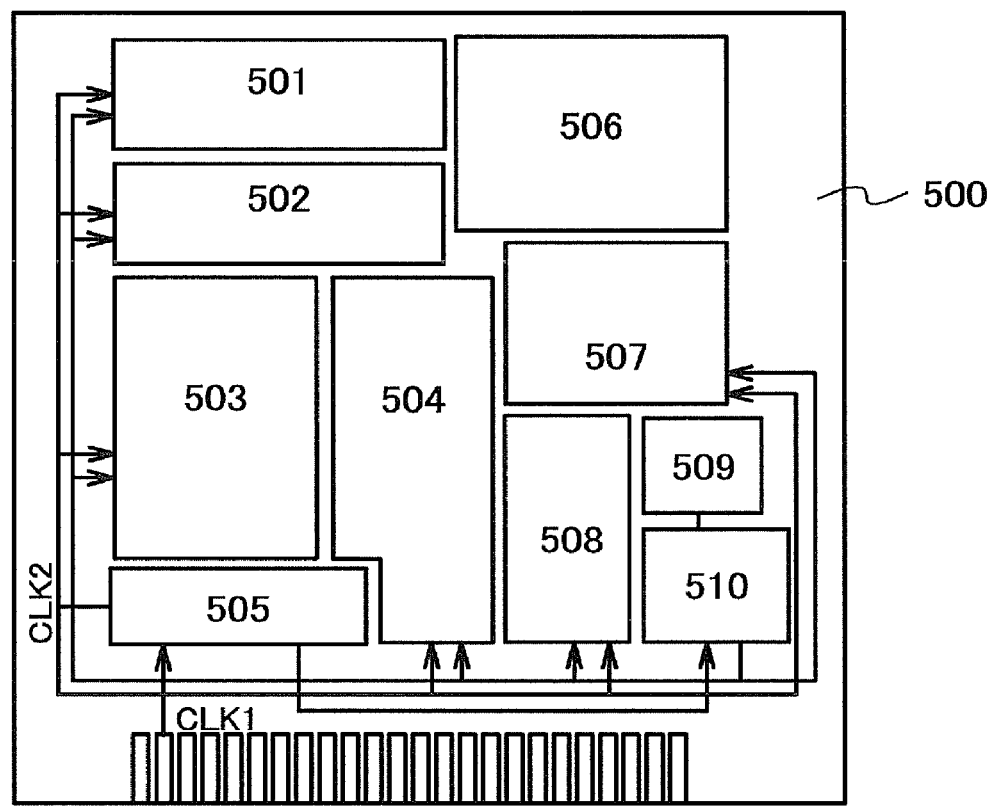
FIG. 7 illustrates an example of a semiconductor device using an SOI substrate.

First, as an example of a semiconductor device, a microprocessor is described. FIG. 7 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates a signal for controlling the operation of the arithmetic logic unit 501. While the microprocessor 500 is executing a program, the interrupt controller 504 judges an interrupt request from an external input/output device or a peripheral circuit based on its priority or a mask state, and processes the interrupt request. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 7, the internal clock signal CLK2 is input to another circuit.

Figure 8:
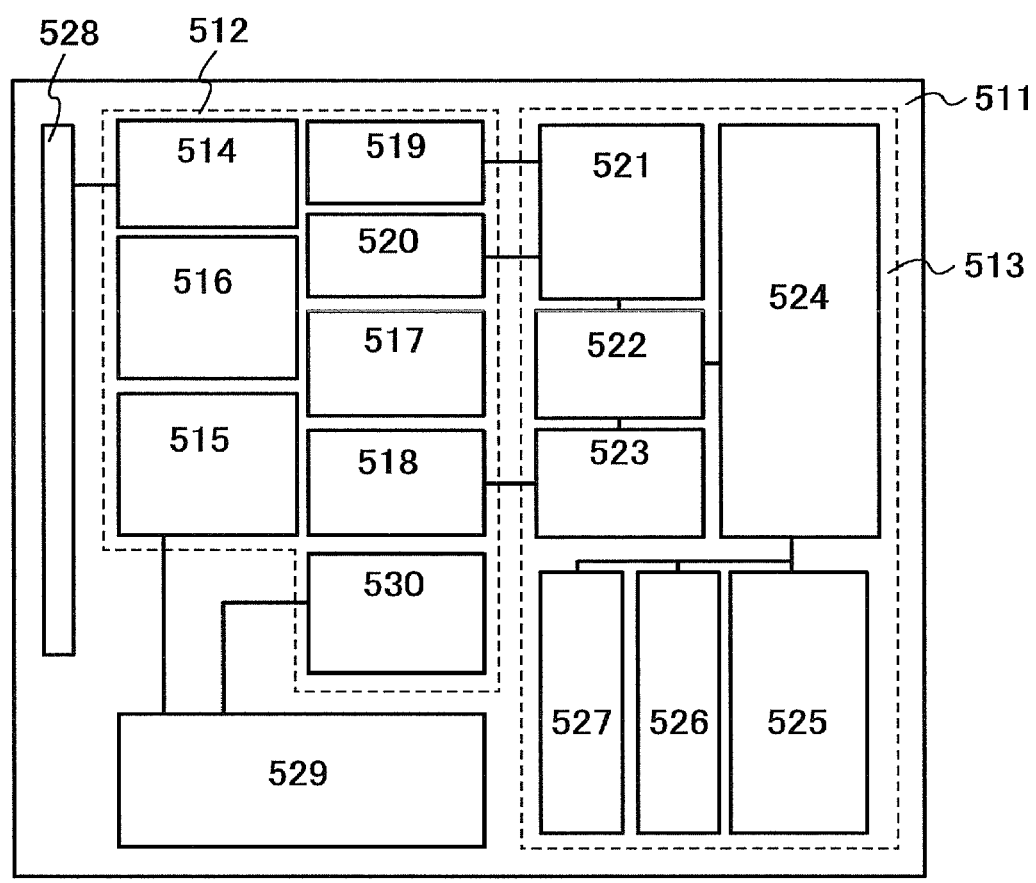
FIG. 8 illustrates an example of a semiconductor device using an SOI substrate.

Next, an example of a semiconductor device having a function of communicating data wirelessly and also having an arithmetic function will be described. FIG. 8 is a block diagram illustrating a structural example of such a semiconductor device. The semiconductor device illustrated in FIG. 8 can be referred to as a computer (hereinafter referred to as an "RFCPU") which operates to transmit/receive signals to/from an external device by wireless communication.

As illustrated in FIG. 8, an RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 is and may be incorporated into the RFCPU 511 as a component.

The reset circuit 517 generates a signal that resets the digital circuit portion 513 to be initialized. For example, the reset circuit 517 generates a signal which rises after rise in the supply voltage with delay as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 through the CPU interface 524. The CPU interface 524 has a function of generating an access signal for any one of the read only memory 527, the random access memory 526, and the control register 522 in accordance with an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Next, a display device is described with reference to FIGS. 10A and 10B, and FIGS. 11A and 11B.

Figure 10A:
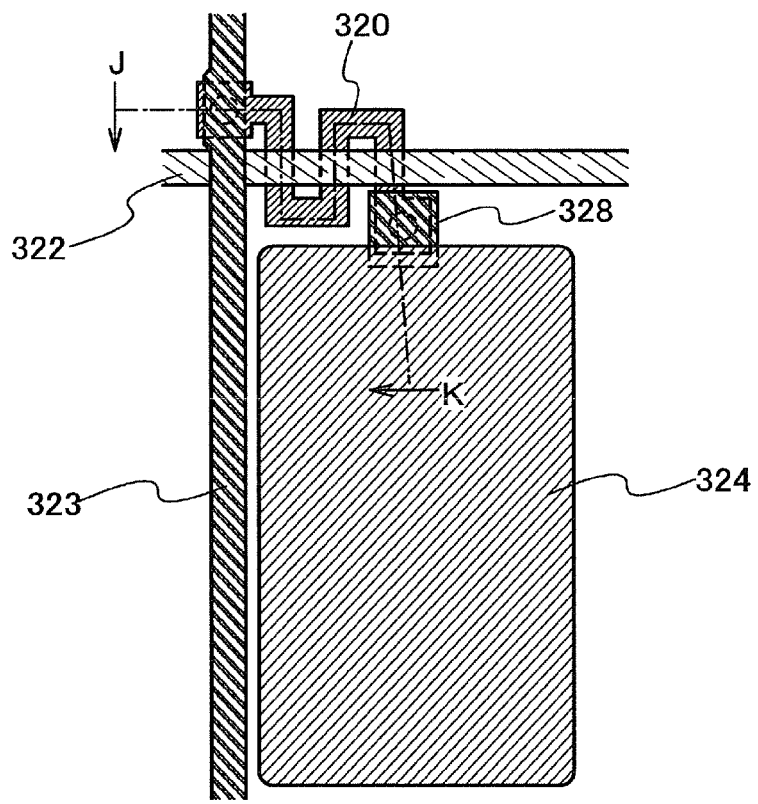
FIGS. 10A and 10B illustrate an example of a display device using an SOI substrate.
Figure 10B:
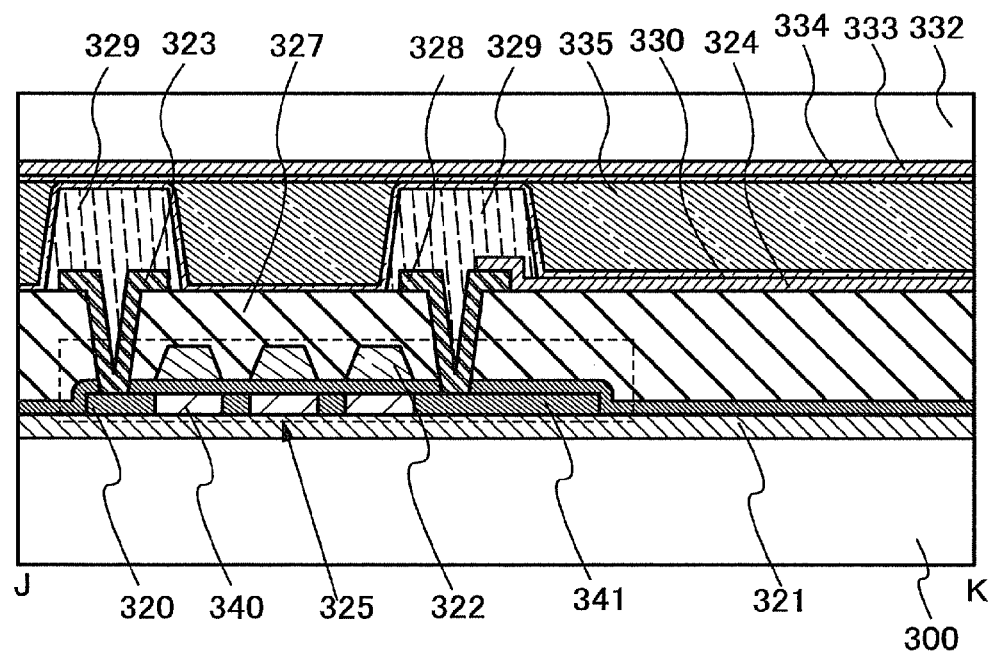

FIGS. 10A and 10B are drawings for describing a liquid crystal display device. FIG. 10A is a plan view of a pixel in a liquid crystal display device. FIG 10B is a cross-sectional view taken along a line J-K of FIG. 10A.

As illustrated in FIG. 10A, a pixel includes a single crystal semiconductor film 320, a scanning line 322 intersecting with the single crystal semiconductor film 320, a signal line 323 intersecting with the scanning line 322, a pixel electrode 324, and an electrode 328 which electrically connects the pixel electrode 324 to the single crystal semiconductor film 320. The single crystal semiconductor film 320 is a single crystal semiconductor film provided over a base substrate 300 and is included in a TFT 325 of the pixel.

As an SOI substrate, the SOI substrate described in the above embodiments is used. As illustrated in FIG. 10B, the single crystal semiconductor film is provided over the base substrate 300 with an insulating film 321 interposed therebetween. A glass substrate can be used for the base substrate 300. The single crystal semiconductor film of the SOI substrate is separated for each element by etching, whereby the single crystal semiconductor film 320 of the TFT 325 is formed. A channel formation region 340 and n-type high-concentration impurity regions 341 into which an impurity element is added are formed in the single crystal semiconductor film 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over an interlayer insulating film 327.

Over the interlayer insulating film 327, columnar spacers 329 are formed. An orientation film 330 is formed to cover the signal line 323, the pixel electrode 324, the electrode 328, and the columnar spacers 329. A counter substrate 332 is provided with a counter electrode 333 and an orientation film 334 which covers the counter electrode 333. The columnar spacers 329 are formed to maintain a space between the base substrate 300 and the counter substrate 332. A liquid crystal layer 335 is formed in the space formed by the columnar spacers 329. The interlayer insulating film 327 has a step at the connection portion between the n-type high concentration impurity regions 341, and the signal line 323 and the electrode 328 due to formation of contact holes; therefore, orientation of liquid crystals in the liquid crystal layer 335 is easily disordered at this connection portion. Therefore, the columnar spacers 329 are formed at these step portions to prevent disorder of liquid crystal orientation.

Figure 11A:
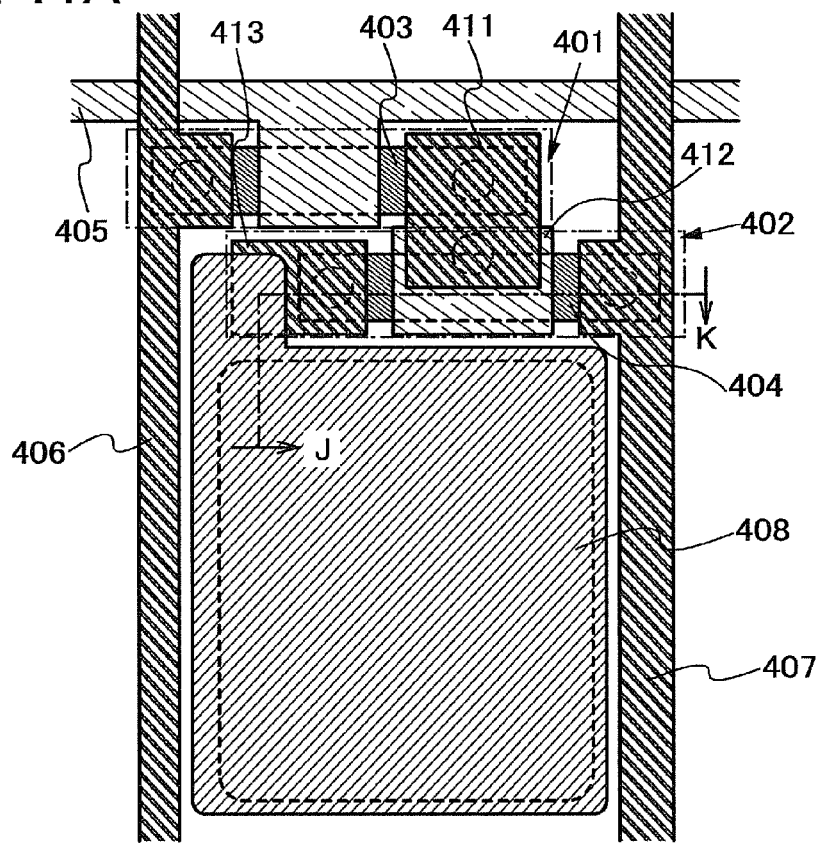
FIGS. 11A and 11B illustrate an example of a display device using an SOI substrate.
Figure 11B:
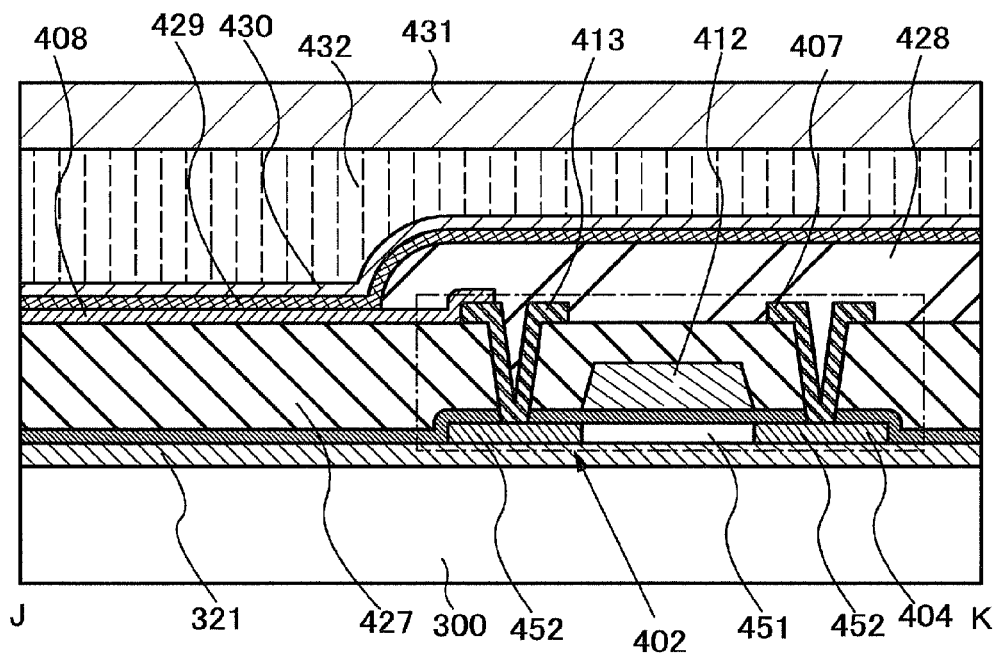

Next, an electroluminescent display device (hereinafter referred to as an EL display device) is described with reference to FIGS. 11A and 11B. FIG 11A is a plan view of a pixel in an EL display device, and FIG. 11B is a cross-sectional view taken along a line J-K in FIG. 11A.

As illustrated in FIG. 11A, a pixel includes a TFT as a selection transistor 401, a TFT as a display control transistor 402, a scanning line 405, a signal line 406, a current supply line 407, and a pixel electrode 408. In the EL display device, each pixel is provided with a light-emitting element having a structure in which a layer including an electroluminescent material (also refer to as an EL layer) is sandwiched between a pair of electrodes. One electrode of the light emitting element is the pixel electrode 408. Further, in a semiconductor film 403, a channel formation region, a source region, and a drain region of the selection transistor 401 are formed. Further, in a semiconductor film 404, a channel formation region, a source region, and a drain region of the display control transistor 402 are formed. The semiconductor films 403 and 404 are each formed of the single crystal semiconductor film provided over a base substrate.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

The display control transistor 402 is a p-channel TFT. As illustrated in FIG. 11B, a channel formation region 451 and p-type high-concentration impurity regions 452 are formed in the semiconductor film 404. Note that as the SOI substrate, the SOI substrate formed by the above embodiment is used.

An interlayer insulating film 427 is formed so as to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition layer 428 having an insulating property. An EL layer 429 is formed over the pixel electrode 408, and a counter electrode 430 is formed over the EL layer 429. A counter substrate 431 is provided as a reinforcing plate and is fixed to the base substrate 300 by a resin layer 432.

The gray scale of the EL display device can be controlled by a current driving method in which luminance of a light-emitting element is controlled by current or a voltage driving method in which luminance of a light-emitting element is controlled by voltage. In the case where there is a large difference in the characteristic value between transistors of pixels, it is preferred to employ the voltage driving method. In order to employ the current driving method in such a case, a correction circuit which corrects characteristic variation can be used. The EL display device is manufactured by a manufacturing process of an SOI substrate, so that the selection transistor 401 and the display control transistor 402 do not have variation in characteristics in each pixel. Thus, the current driving method can be employed.

In other words, a variety of electronic appliances can be manufactured by using SOI substrates. The electronic appliances include cameras such as video cameras or digital cameras, navigation systems, audio reproducing devices (such as car audios or audio components), computers, game machines, portable information terminals (such as mobile computers, mobile phones, portable game machines, or e-book readers), and image reproducing devices having storage media (specifically, devices provided with display devices capable of playing audio data stored in recording media such as digital versatile disk (DVD) and displaying stored image data). Examples of these devices are illustrated in FIGS. 14A to 14C.

Figure 14A:
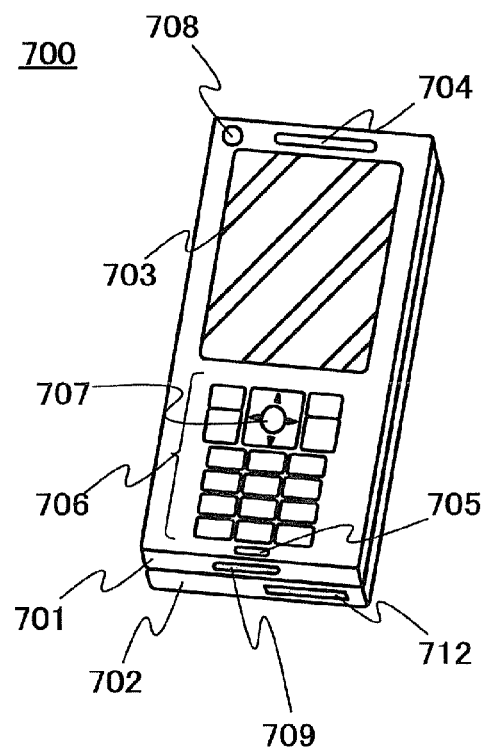
FIGS. 14A to 14C illustrate an electronic appliance using an SOI substrate.
Figure 14B:
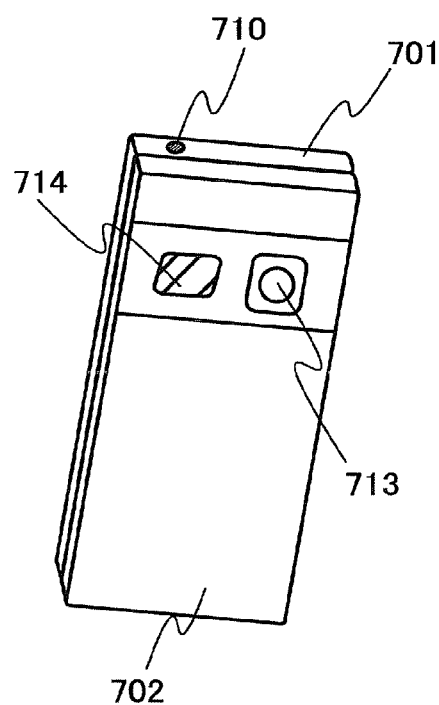
Figure 14C:
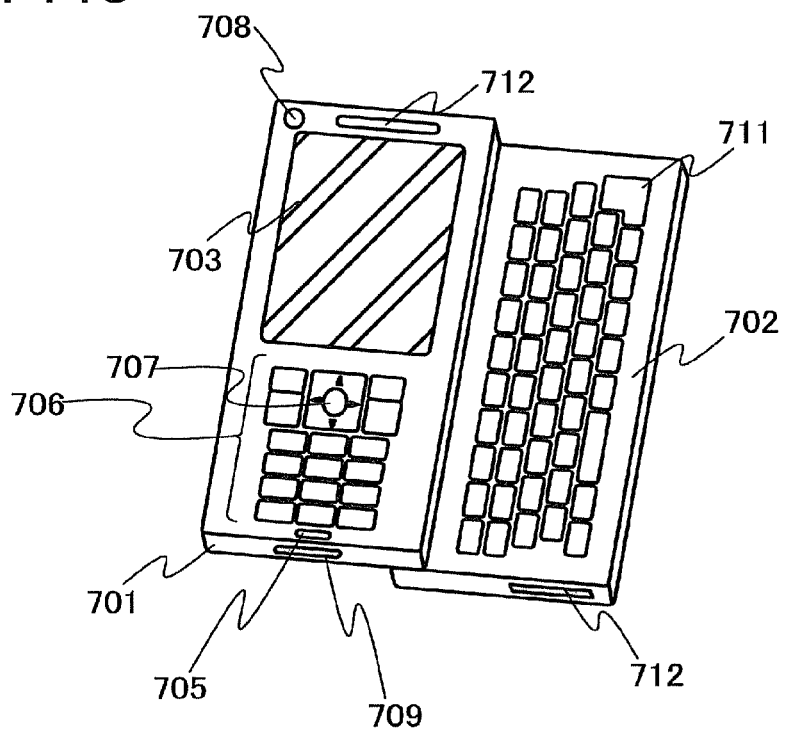

FIGS. 14A to 14C illustrate an example of a mobile phone to which the above-described semiconductor device is applied. FIG. 14A is a front view, FIG. 14B is a rear view, and FIG. 14C is a front view in which two chassis are slid. A mobile phone 700 has two chassis 701 and 702. The mobile phone 700 has both functions of a mobile phone and a portable information terminal and incorporates a computer. The mobile phone 700 is a so-called "smartphone," with which a variety of data processing is possible in addition to telephone conversation.

The mobile phone 700 has the chassis 701 and 702. The chassis 701 includes a display portion 703, a speaker 704, a microphone 705, operation keys 706, a pointing device 707, a front camera lens 708, a jack 709 for an external connection terminal, an earphone terminal 710, and the like. The chassis 702 includes a keyboard 711, an external memory slot 712, a rear camera 713, a light 714, and the like. In addition, an antenna is incorporated in the chassis 701.

Further, in addition to the above structure, the mobile phone 700 may incorporate a non-contact IC chip, a small memory device, or the like.

The chassis 701 and 702 which overlap with each other (see FIG. 14A) can be slid, and are developed by being slid as illustrated in FIG. 14C. The display panel or the display device that is manufactured according to any of the methods for manufacturing a display device in Embodiments 2 and 3 can be incorporated in the display portion 703. Since the front camera lens 708 is provided in the same plane as the display portion 703 is, the mobile phone 700 can be used as a videophone. Further, a still image and a moving image can be taken with the rear camera 713 and the light 714, using the display portion 703 as a viewfinder.

With the use of the speaker 704 and the microphone 705, the mobile phone 700 can be used as an audio recording device (recording device) or an audio reproducing device. With the use of the operation keys 706, further, operations of incoming and outgoing of calls, simple information input such as electronic mail, scrolling of a screen displayed in the display portion, cursor movement, e.g., for selecting information to be displayed in the display portion, and the like are possible.

If much information needs to be treated by documentation, a use as a portable information terminal, and the like, it is convenient to use the keyboard 711. Furthermore, by sliding the chassis 701 and 702 which overlap with each other (see FIG. 14A), the chassis 701 and 702 can be developed as illustrated in FIG. 14C. In using the mobile phone 700 as a portable information terminal, a cursor can be moved smoothly with the use of the keyboard 711 and the pointing device 707. The jack 709 for an external connection terminal can be connected to an AC adapter or a variety of cables such as a USB cable, and charging and data communication with a personal computer or the like is possible. Further, by inserting a recording medium in the external memory slot 712, a larger amount of data can be stored and moved.

The rear face of the chassis 702 (see FIG. 14) is provided with the rear camera 713 and the light 714, and a still image and a moving image can be taken using the display portion 703 as a viewfinder.

Further, the mobile phone may have an infrared communication function, a USB port, a function of receiving one segment television broadcast, a non-contact IC chip, an earphone jack, or the like, in addition to the above functions and structures.

The variety of electronic appliances described in this embodiment can be manufactured by any of the methods for manufacturing a transistor and a display device; therefore, application of the above embodiments can improve display characteristics and productivity of these electronic appliances.

This application is based on Japanese Patent Application serial no. 2008-007062 filed with Japan Patent Office on Jan. 16, 2008, the entire contents of which are hereby incorporated by reference.

What is claimed is:

1. A method for manufacturing an SOI substrate comprising the steps of:
   bonding two single crystal semiconductor substrates on a first surface of a base substrate having an insulating surface with a gap between the two single crystal semiconductor substrates,
   wherein each of the two single crystal semiconductor substrates comprises an insulating film over a surface thereof and a separation layer formed therein; and
   heating the base substrate after the bonding, allowing a single crystal semiconductor layer to be separated from each of the two single crystal semiconductor substrates along the separation layer,
   wherein, during the heating, the base substrate is supported by a plurality of supports,
   wherein, during the heating, the plurality of supports are in contact with a second surface of the base substrate opposite to the first surface of the base substrate, and
   wherein a region where one of the plurality of supports and the second surface of the base substrate are in contact with each other overlaps the gap.

2. The method for manufacturing an SOI substrate according to claim 1,
   wherein the heating is performed in a heat treatment apparatus comprising:
   a treatment chamber;
   a supporting base provided in the treatment chamber;
   the plurality of supports which are provided over the supporting base and are arranged to support the base substrate; and
   a heating unit for heating the base substrate,
   wherein a position of each of the plurality of supports is configured to be changed over the supporting base.

3. The method for manufacturing an SOI substrate according to claim 1,
   wherein the heating is performed in a heat treatment apparatus comprising:
   a treatment chamber;
   a supporting base provided in the treatment chamber;
   a plurality of fixing parts provided over the supporting base;
   the plurality of supports which are arranged to be fixed to the supporting base by the plurality of fixing parts and are configured to support the base substrate; and
   a heating unit for heating the base substrate,
   wherein the plurality of supports are arranged to be detached from the plurality of fixing parts.

4. The method for manufacturing an SOI substrate according to claim 1,
   wherein the plurality of supports comprise quartz.

5. The method for manufacturing an SOI substrate according to claim 1,
   wherein the heating is performed in a heat treatment apparatus comprising:
   a treatment chamber;
   a supporting base provided in the treatment chamber; and
   the plurality of supports which are provided over the supporting base and are arranged to support the base substrate,
   wherein a second gap is provided between the second surface of the base substrate and the supporting base by the plurality of supports.

6. A method for manufacturing an SOI substrate comprising the steps of:
   forming an insulating film over each surface of two single crystal semiconductor substrates;
   forming a separation layer in each of the two single crystal semiconductor substrates;
   bonding the two single crystal semiconductor substrates on a first surface of a base substrate having an insulating surface with a gap between the two single crystal semiconductor substrates; and
   heating the base substrate after the bonding, allowing a single crystal semiconductor layer to be separated from each of the two single crystal semiconductor substrates along the separation layer,
   wherein, during the heating, the base substrate is supported by a plurality of supports,
   wherein, during the heating, the plurality of supports are in contact with a second surface of the base substrate opposite to the first surface of the base substrate, and
   wherein a region where one of the plurality of supports and the second surface of the base substrate are in contact with each other overlaps the gap.

7. The method for manufacturing an SOI substrate according to claim 6,
   wherein the insulating film comprises a material selected from silicon oxide, silicon oxynitride, silicon nitride, and silicon nitride oxide.

8. The method for manufacturing an SOI substrate according to claim 6,
   wherein the separation layer is formed by addition of ions to each of the two single crystal semiconductor substrates.

9. The method for manufacturing an SOI substrate according to claim 6,
   wherein the separation layer is formed by addition of hydrogen ions to each of the two single crystal semiconductor substrates.

10. The method for manufacturing an SOI substrate according to claim 6, further comprising a step of surface treatment of the insulating film to increase hydrophilicity thereof.

11. The method for manufacturing an SOI substrate according to claim 6, further comprising a step of surface treatment of the base substrate to increase hydrophilicity thereof.

12. The method for manufacturing an SOI substrate according to claim 6,
wherein the plurality of supports comprise quartz.

13. The method for manufacturing an SOI substrate according to claim 6,
wherein the heating is performed in a heat treatment apparatus comprising:
a treatment chamber;
a supporting base provided in the treatment chamber; and
the plurality of supports which are provided over the supporting base and are arranged to support the base substrate,
wherein a second gap is provided between the second surface of the base substrate and the supporting base by the plurality of supports.

14. A method for manufacturing an SOI substrate comprising the steps of:
forming a separation layer in each of two single crystal semiconductor substrates;
bonding the two single crystal semiconductor substrates on a first surface of an insulating base substrate with a gap between the two single crystal semiconductor substrates; and
heating the insulating base substrate after the bonding, allowing a single crystal semiconductor layer to be separated from each of the two single crystal semiconductor substrates along the separation layer,
wherein, during the heating, the insulating base substrate is supported by a plurality of supports,
wherein, during the heating, the plurality of supports are in contact with a second surface of the insulating base substrate opposite to the first surface of the insulating base substrate, and
wherein a region where one of the plurality of supports and the second surface of the insulating base substrate are in contact with each other overlaps the gap.

15. The method for manufacturing an SOI substrate according to claim 14,
wherein the separation layer is formed by addition of ions to each of the two single crystal semiconductor substrates.

16. The method for manufacturing an SOI substrate according to claim 14,
wherein the separation layer is formed by addition of hydrogen ions to each of the two single crystal semiconductor substrates.

17. The method for manufacturing an SOI substrate according to claim 14, further comprising a step of surface treatment of the insulating base substrate to increase hydrophilicity thereof.

18. The method for manufacturing an SOI substrate according to claim 14,
wherein the plurality of supports comprise quartz.

19. The method for manufacturing an SOI substrate according to claim 14,
wherein the heating is performed in a heat treatment apparatus comprising:
a treatment chamber;
a supporting base provided in the treatment chamber; and
the plurality of supports which are provided over the supporting base and are arranged to support the insulating base substrate,
wherein a second gap is provided between the second surface of the insulating base substrate and the supporting base by the plurality of supports.

* * * * *